United States Patent
Iwaki

(10) Patent No.: US 6,655,671 B2
(45) Date of Patent: Dec. 2, 2003

(54) PRINTED-WIRING-BOARD HOLDING APPARATUS

(75) Inventor: Noriaki Iwaki, Hekinan (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 137 days.

(21) Appl. No.: 09/892,516

(22) Filed: Jun. 28, 2001

(65) Prior Publication Data

US 2002/0014000 A1 Feb. 7, 2002

(30) Foreign Application Priority Data

Aug. 4, 2000 (JP) ........................................ 2000-237423

(51) Int. Cl.⁷ .............................................. B25B 11/00
(52) U.S. Cl. ..................................... 269/21; 269/289 R
(58) Field of Search ................... 269/21, 20, 289 MR; 294/64.1; 279/3

(56) References Cited

U.S. PATENT DOCUMENTS

| | | | | |
|---|---|---|---|---|
| 4,088,312 A | * | 5/1978 | Frosch et al. | 269/21 |
| 4,184,292 A | * | 1/1980 | DeFazio et al. | 269/21 |
| 5,853,169 A | * | 12/1998 | Hern et al. | 269/21 |
| 6,257,564 B1 | * | 7/2001 | Avneri et al. | 269/21 |
| 6,264,185 B1 | * | 7/2001 | Isobe et al. | 269/21 |
| 6,439,559 B1 | * | 8/2002 | Kinnard et al. | 269/21 |

FOREIGN PATENT DOCUMENTS

| | | |
|---|---|---|
| GB | 2322 089 A | 8/1998 |
| JP | A 7-15189 | 1/1995 |
| JP | A 7-15191 | 1/1995 |
| JP | B2 2824378 | 9/1998 |
| WO | WO 00/08905 | 2/2000 |

OTHER PUBLICATIONS

U.S. patent application Ser. No. 09/915,383, Isogai et al., filed Jul. 27, 2001.
U.S. patent application Ser. No. 09/915,579, Isogai et al., filed Jul. 27, 2001.
U.S. patent application Ser. No. 09/915,536, Isogai et al., filed Jul. 27, 2001.

* cited by examiner

*Primary Examiner*—Lee D. Wilson
(74) *Attorney, Agent, or Firm*—Oliff & Berridge, PLC

(57) ABSTRACT

An apparatus for holding a printed wiring board, including a holding table having a plurality of negative-pressure-supply holes in the upper surface, a holding member attachable to the upper surface of the holding table with a lower end surface, in contact with the holding table, surrounding the opening of one negative-pressure-supply hole. The holding member having a negative-pressure passage therethrough. The holding member supports, at an upper end surface, the printed wiring board, by applying a negative pressure via the negative-pressure-supply hole and the negative-pressure passage, to hold the board. An opening and closing valve associated with each negative-pressure-supply holes, to close the negative-pressure-supply hole where a holding member is not attached to the table and to open the corresponding hole, where a holding member is attached to the table to communicate with the negative-pressure passage.

23 Claims, 22 Drawing Sheets

PRINTED-WIRING-BOARD HOLDING APPARATUS

BACKGROUND OF THE INVENTION

1. Field of the Invention

The present invention relates to a printed-wiring-board holding apparatus and particularly to such an apparatus which applies suction or negative pressure to a printed wiring board (PWB) and thereby holds the PWB. A PWB on which electric components (e.g., electronic components) have been mounted should be called as a printed circuit board (PCB) but, in the present specification, a PCB is also referred to as a PWB, for avoiding complexity.

2. Discussion of Related Art

Generally, a PWB includes a thin substrate formed of an electrically insulating material such as a synthetic resin, and a circuit pattern formed of an electrically conductive material on the thin substrate. Thus, the PWB has flexibility. Therefore, when electric components (ECs) are mounted on the PWB, or when an adhesive or a creamed solder is applied to the PWB for mounting of ECs, the PWB cannot maintain an accurately flat posture, if a back surface of the PWB is not supported at a considerably large number of points.

To solve this problem, Japanese Patent Document No. 7-15189 teaches applying a negative pressure to a PWB and thereby holding the same. More specifically described, the document discloses a PWB holding apparatus including a base plate and a plurality of backup pins. The base plate has a plurality of negative-pressure supply holes each of which opens in an upper surface thereof and is connected via a passage formed therein to a negative-pressure supply source. Each of the backup pins includes an elongate pin portion and a container-like seat portion, and the pin portion has a passage which is formed therethrough in an axial direction thereof and is communicated with an inner space of the seat portion. Each backup pin is attached to the upper surface of the base plate, such that a lower-end surface of the seat portion thereof is held in close contact with a portion of the upper surface that surrounds the opening of a negative-pressure supply hole. In this state, the inner passage of the pin portion of the pin is communicated with the negative-pressure supply hole via the inner space of the seat portion, so that negative pressure is supplied to the inner passage to suck a PWB and thereby support the back or lower surface thereof.

The backup pins support the back surface of the PWB that is opposite to the front surface for which an operation, such as mounting of ECs, is performed. However, the backup pins must not engage uneven portions of the back surface of the PWB itself or the ECs mounted on the back surface. Therefore, the backup pins must be engaged with only limited portions of the back surface of the PWB and, depending upon those limited portions of the back surface, the backup pins must be attached to only limited portions of the upper surface of the base plate. Thus, the backup pins are attached to selected ones of the negative-pressure supply holes of the base plate, and the remaining supply holes to which the backup pins are not attached are covered with respective caps to avoid any leakage of the negative pressure.

However, it is cumbersome to attach the caps to the negative-pressure supply holes free of the backup pins, and accordingly it is time-consuming to attach the backup pins and the caps to the base plate and thereby set the PWB holding apparatus so that the apparatus can apply the negative pressure to a PWB and thereby hold the same.

SUMMARY OF THE INVENTION

The present invention provides a printed-wiring-board holding apparatus that has each feature described below. The following features are described, like claims, in respective paragraphs that are given respective sequential numbers. Any feature that includes another feature shall do so by referring to the number given to the latter feature. However, the following features and the appropriate combinations thereof are just examples to which the technical features, and the combinations thereof, described in the specification are by no means limited. In addition, in the case where one feature recites a plurality of items, it is not essentially required that all of those items be simultaneously employed in the one feature. That is, it is possible to select and employ only a portion (one, two, . . . , but not all) of those items.

(1) According to a first feature of the present invention, there is provided an apparatus for holding a printed wiring board, comprising a holding table which has a flat upper surface and a plurality of negative-pressure-supply holes each of which has an opening in the upper surface; at least one holding member which is attachable to the upper surface of the holding table such that a lower end surface of the holding member is held in close contact with a portion of the upper surface that surrounds the opening of at least one of the negative-pressure-supply holes, the holding member having a negative-pressure passage which is formed therethrough to connect between the lower end surface thereof and an upper end surface thereof, the holding member supporting, at the upper end surface thereof, the printed wiring board, and applying a negative pressure supplied from the at least one negative-pressure-supply hole via the negative-pressure passage thereof, to the board and thereby holding the board; and a plurality of opening and closing valves which are associated with the plurality of negative-pressure-supply holes, respectively, each of the opening and closing valves closing a corresponding one of the negative-pressure-supply holes in a state in which the holding member is not attached to the portion of the upper surface of the holding table that surrounds the opening of the corresponding one negative-pressure-supply hole, and opening the corresponding one hole, in a state in which the holding member is attached to the portion of the upper surface, so that the corresponding one hole is communicated with the negative-pressure passage of the holding member.

One holding member may be held in close contact with a portion of the upper surface of the holding table that surrounds the opening of one negative-pressure-supply hole, or the respective openings of two or more negative-pressure-supply holes. One or more holding members are attached to the holding table, at only one or more positions corresponding to one or more negative-pressure-supply holes selected from all the negative-pressure-supply holes of the holding table. The holding member or members attached to the holding table opens or open the opening and closing valve or valves, so that the selected negative-pressure-supply hole or holes is or are communicated with the negative-pressure passage or passages of the holding member or members and the negative pressure (i.e., vacuum or suction) is supplied from the negative-pressure-supply hole or holes to the negative-pressure passage or passages. Since the holding member supports, at its upper-end surface, the lower surface of the printed wiring board (PWB), the PWB does not sag; and since the holding member applies the negative pressure to the PWB and thereby holds the PWB, the PWB does not warp upward. That is, the holding member can hold a desired portion of the PWB such that the PWB does not warp in directions toward, and away from, the holding table. Regarding a negative-pressure-supply hole to which a holding member is not attached, the opening and closing valve associated with the hole remains closed to prevent leakage of the negative pressure. Thus, no plug or cap is needed to close the negative-pressure-supply hole to which no holding member is attached, unlike in a conventional PWB-holding device. That is, the present PWB holding apparatus can be easily set in a short time so that the holding apparatus can hold a desired portion of a PWB at a desired distance from the holding table.

(2) According to a second feature of the present invention that includes the first feature (1), the each opening and closing valve comprises a valve hole which is provided at an end portion of the corresponding one negative-pressure-supply hole on a side of the opening thereof in the upper surface of the holding table; a valve seat which is provided by a portion of the holding table and faces upward in the valve hole; a valve member which is provided in the valve hole and which closes the corresponding one hole in a state in which the valve member is seated on the valve seat; and a coming-off preventing portion which prevents the valve member from coming off the valve hole, at least the portion of the holding table being formed of a non-magnetic material, one of the valve member and a portion of the holding member in a vicinity of the lower end surface thereof being formed of a permanent magnet, and the other of the valve member and the portion of the holding member being formed of a ferromagnetic material.

At least a portion of the holding table that provides the valve seat is formed of a non-magnetic material. Therefore, irrespective of whether the valve member may be formed of a permanent magnet or a ferromagnetic material, the valve member is seated, because of its own weight, on the valve seat to close the opening and closing valve, in the state in which the holding member is not attached to the holding table. On the other hand, in the state in which the holding member is attached to the holding table, one of the valve member and the holding member that is formed of a ferromagnetic material is magnetized, and the valve member is attracted by the magnetic force to the holding member and is moved away from the valve seat, so that the opening and closing valve is opened. Since the valve hole is provided with the coming-off preventing portion, the valve member does not come off the valve hole, so that when the holding member is detached from the holding table, the valve member is seated, owing to its own weight, on the valve seat to close the valve. The valve member of an opening and closing valve which is associated with a negative-pressure-supply hole to which a holding member is not attached remains closed, so that when the hole is supplied with the negative pressure, the valve member is sucked owing to the negative pressure, and is seated on the valve seat, to prevent leakage of the negative pressure. The valve member may take any of known shapes such as sphere, hemisphere, cone, truncated cone, or cylinder having a hemispherical end portion or a truncated-conical end portion. In the case where the valve member has a hemispherical shape, a conical shape, a truncated-conical shape, or a cylindrical shape having a hemispherical end portion or a truncated-conical end portion, the valve member has, in one end portion thereof, a flat surface which is perpendicular to an axis line thereof and is to be attracted by a magnetic force, and is provided in the valve hole such that the flat surface is located on the side of the coming-off preventing portion. Since the flat surface of the valve member that is attracted by the portion of the holding member in the vicinity of its lower end surface has a large area, the valve member is attracted by a strong magnetic force. In the case where the valve member has a shape having an orientation, such as a semispherical shape, that is, the valve member includes a first portion designed to seat on the valve seat and a second portion designed to engage the coming-off preventing portion, it is desirable that the first and second portions of the valve member be not inclined relative to the valve seat, that is, the orientation of the valve member relative to the valve seat be maintained, notwithstanding the valve member is iteratively seated on and off the valve seat. That is, it is desirable to employ an inclination preventing device which prevents the valve member from being inclined relative to the valve seat. For example, if a distance between the flat surface of the valve member and the coming-off preventing portion is short, the engagement of those two elements prevents the valve member from being inclined, so that the valve member may be seated, without being inclined, on the valve seat to close assuredly the opening and closing valve. In this case, the flat surface of the valve member cooperates with a surface of the coming-off preventing portion that engages the flat surface to provide the inclination preventing device. Alternatively, it is possible to provide a small space between an outer surface of the valve member and an inner surface defining the valve hole, so that those two surfaces engage each other and thereby prevent the valve member from being inclined. In the latter case, those two surfaces cooperate with each other to provide the inclination preventing device. In the case where the valve member has a conical shape, a truncated-conical shape, or a shape including a truncated-conical end portion and a cylindrical end portion, it is desirable that a distance between a seat portion of the valve member that is seated on the valve seat and one end portion of the valve member that is opposite to the other end portion thereof located on the side of the coming-off preventing portion, as measured in a direction parallel to the axis line of the valve member, be longer than a distance between the seat portion and the other end portion. In the last case, the valve member hangs, at the seat portion thereof, on the valve seat, owing to its own weight, such that the axis line of the valve member is not inclined relative to the valve seat. The seat portion of the valve member cooperates with a portion thereof between the seat portion and the one end portion thereof to provide the inclination preventing device.

(3) According to a third feature of the present invention that includes the second feature (2), the portion of the holding member is formed of the permanent magnet, and the valve member is formed of the ferromagnetic material.

In many cases, the portion of the holding member in the vicinity of its lower end surface is larger than the valve member. Therefore, according to the present feature, the larger magnet produces a larger magnetic force, so that the valve member can be reliably moved away from the valve seat.

In addition, since the valve member is formed of a ferromagnetic material, the coming-off preventing portion may be also formed of a ferromagnetic material. When the coming-off preventing portion is magnetized by the permanent magnet of the holding member, the valve member formed of ferromagnetic material is attracted to the preventing portion, so that the valve member is reliably moved away from the valve seat. In particular, in a case, described later, where a coming-off preventing plate formed of ferromagnetic material is fixed to a main member of the holding table that is formed of non-magnetic material, and a portion of the preventing plate that corresponds to the valve hole functions as the coming-off preventing portion, the coming-off preventing plate is magnetized by the permanent magnet that provides the portion of the holding member in the vicinity of its lower end surface, so that the holding member is fixed with a sufficiently great magnetic force to the preventing plate, and the valve member is attracted to the magnetized preventing plate to open the opening and closing valve.

Moreover, the valve member enjoys a high degree of freedom with respect to its shape. In the case where the valve member is formed of a permanent magnet, it is essentially required that the orientation of magnetic poles of the permanent magnet be not changed even if the valve member is iteratively seated on and off the valve seat. On the other hand, in the case where the valve member is formed of a ferromagnetic material, it does not matter with the orientation of the valve member, that is, the phase of the valve member may change each time the valve member is seated on or off the valve seat. Thus, the shape of the valve member can be freely designed. In the case where the valve member is formed of permanent magnet, it is desirable to employ an orientation maintaining device which maintains an orientation of the valve member and thereby prevents an orientation of the magnetic poles of the permanent magnet from being changed. For example, in the case where the valve member has a shape having an orientation, such as a cylindrical shape having a hemispherical end portion, it is possible to employ the inclination preventing device as explained in connection with the second feature (2), so that the inclination preventing device prevents the valve member from being inclined and accordingly being rotated, and thereby prevents the orientation of the magnetic poles of the permanent magnet. The orientation maintaining device may be provided separately from the inclination preventing device, in addition to, or in place of, the same.

(4) According to a fourth feature of the present invention that includes the second or third features (2) or (3), the valve member comprises a spherical member.

If the valve member is provided by a spherical member, the spherical member is easily seated on the valve seat to close reliably the opening and closing valve. In addition, since the valve member may be provided by a commercially available steel ball, the valve can be produced at low cost.

(5) According to a fifth feature of the present invention that includes any one of the second to fourth features (2) to (4), the coming-off preventing portion comprises a coming-off preventing member which covers the opening of the corresponding one negative-pressure-supply hole, which is engageable with the valve member to prevent the valve member from coming off the valve hole, and which has at least one communication hole which is not closed by the valve member engaged with the coming-off preventing member, and keeps the communication between the corresponding one hole and the negative-pressure passage of the holding member.

The coming-off preventing member may have either one communication hole, or a plurality of communication holes. The shape of the communication hole or holes may be one of various known shapes, such as a circular or sectorial shape.

The negative pressure is supplied from the negative-pressure-supply hole to the negative-pressure passage via the communication hole or holes.

(6) According to a sixth feature of the present invention that includes the fifth feature (5), the portion of the holding member is formed of the permanent magnet, and the coming-off preventing member is formed of a ferromagnetic material.

If the holding member is placed on the holding table, the valve member and the coming-off preventing member are magnetized, so that the valve member is attracted to the preventing member, and the holding member is also attracted to the valve member and the preventing member and is fixed to the holding table. The coming-off preventing member and the valve member, both formed of ferromagnetic material, cooperate with a portion of the holding member that is formed of permanent magnet, to provide a fixing device. Otherwise, the holding member may be fixed to the holding table, with a different fixing device such as a bolt. However, it is cumbersome to use the latter fixing device to fix the holding member to the holding table. In contrast, since the magnetic force is used to fix the holding member to the holding table, it is just needed to place the holding member on the holding table, which assures that the holding member is easily attached to the holding table in a short time.

In the state in which the holding member holds the PWB, the holding member is strongly fixed, owing to the negative pressure, to the holding table. The lower end of the holding member is held in close contact with a portion of the upper surface of the holding table that surrounds the opening of a negative-pressure-supply hole. When the negative pressure supplied to the negative-pressure passage is applied to the PWB, the negative pressure is also applied to the holding member, so that the holding table holds the holding member. This holding function may be positively utilized in a state in which the holding member is not holding a PWB. To this end, for example, a flow restrictor is provided in the negative-pressure passage formed through the holding member. In the state in which the holding member is not holding a PWB, air flows into the negative-pressure passage via the upper open end of the holding member, while the flow restrictor restricts the amount of incoming flow of the air. Thus, a sufficiently great negative pressure is produced in an inner space of the lower end portion of the holding member that is adapted to contact closely the hole-opening surrounding portion of the upper surface of the holding table.

(7) According to a seventh feature of the present invention that includes the fifth or sixth feature (5) (6), wherein the coming-off preventing member has, in a lower surface thereof, a positioning recess which accommodates at least a portion of the valve member and thereby positions the valve member relative to the valve hole.

According to this feature, in a state in which the coming-off preventing member prevents the valve member from coming off the valve hole, the valve member may be positioned relative to the communication hole in a radial direction of the valve hole. Thus, the communication hole is not closed by the valve member, and the communication between the negative-pressure-supply hole and the negative-pressure passage is reliably maintained.

(8) According to an eighth feature of the present invention that includes any one of the fifth to seventh features (5) to (7), the coming-off preventing member comprises a coming-off preventing plate which is fixed to the upper surface of the holding table and covers the respective valve holes of at least two opening and closing valves associated with at least a portion of the plurality of negative-pressure-supply holes.

The coming-off preventing plate may have a size which can cover a plurality of valve holes corresponding to all the negative-pressure-supply holes, or a size which can cover a plurality of valve holes corresponding to a portion of the negative-pressure-supply holes.

According to this feature, a portion of the coming-off preventing plate that corresponds to a valve hole functions as a coming-off preventing portion. If a portion of the holding member in the vicinity of its lower end surface is formed of permanent magnet, the valve member is formed of ferromagnetic material, and the coming-off preventing plate is also formed of ferromagnetic material, the holding member is fixed to the holding table with a sufficiently great magnetic force produced by the preventing plate formed of ferromagnetic material.

Since the single coming-off preventing plate can cover a plurality of valve holes, the preventing plate can be easily attached to the holding table.

(9) According to a ninth feature of the present invention that includes the first feature (1), the each opening and closing valve comprises a valve hole which is provided at an end portion of the corresponding one negative-pressure-supply hole on a side of the opening thereof and which has a diameter greater than a diameter of the one negative-pressure-supply hole; a valve-seat member which is fixedly provided on the holding table such that the valve-seat member covers an opening of the valve hole and which has a through-hole formed therethrough and a valve seat formed around the through-hole; a valve member which is provided in the valve hole such that the valve member is movable to a closing position where the valve member is seated on the valve seat and to an opening position where the valve member is away from the valve seat; a spring member which applies a biasing force to the valve member in a direction toward the valve seat; and a valve-opening projection which projects from one of the holding member and the valve member, and which engages, in a state in which the holding member is held in close contact with the portion of the upper surface of the holding table that surrounds the opening of the corresponding one hole, the other of the holding member and the valve member to position the valve member at the opening position against the biasing force of the spring member, and allows the valve member to be positioned at the closing position by the biasing force of the spring member in a state in which the holding member is not held in close contact with the portion of the upper surface of the holding table.

The PWB holding apparatus according to this feature is operated such that in the state in which the holding member is attached to the holding table, the valve-opening projection engages the other of the holding member and the valve member, so that the valve member is moved away from the valve seat and the negative-pressure passage is communicated with the negative-pressure-supply hole. In the state in which the holding member is not attached to the holding table, the valve member is seated on the valve seat to close the opening and closing valve. Thus, it is not needed to close, with one or more closure members, one or more negative-pressure-supply holes to which no holding members are attached. Thus, the PWB holding apparatus can be easily set in a short time such that the holding apparatus can hold one or more desired portions of the PWB at a a desired distance from the holding table.

(10) According to a tenth feature of the present invention that includes the ninth feature (9), the valve-opening projection projects from the valve member such that in a state in which the valve member is seated on the valve seat, the projection extends through the through-hole of the valve-seat member and a free end portion of the projection is located outside the through-hole.

(11) According to an eleventh feature of the present invention that includes the ninth feature (9), the valve-opening projection projects downward from the holding member such that a free end portion of the projection is located below the lower end surface of the holding member, and such that in the state in which the holding member is attached to the holding table, the projection extends through the through-hole of the valve-seat member, projects into the valve hole, and pushes the valve member away from the valve seat against the biasing force of the spring member.

So long as the valve-opening projection fits in the through-hole, the communication between the negative-pressure-supply hole of the holding table and the negative-pressure passage of the holding member is maintained. Thus, the valve-opening projection also functions as a communication-maintaining projection.

(12) According to a twelfth feature of the present invention that includes any one of the second to eleventh features (2) to (11), the each opening and closing valve further comprises a sealing member which prevents, in a state in which the valve member is seated on the valve seat, the negative pressure from leaking from between the valve member and the valve seat.

(13) According to a thirteenth feature of the present invention that includes the twelfth feature (12), the sealing member comprises a pad which is formed of a material softer than a material used to form the valve seat and which covers the valve seat.

The pad may be formed of a synthetic resin or a rubber.

When the holding member is detached from the holding table, the valve member is seated on the valve seat via the pad. Therefore, the opening and closing valve recited in any one of the second to eighth features (2) to (8) is operated such that in the state in which the negative pressure is supplied to the negative-pressure-supply hole, the valve member is sucked owing to the negative pressure, and pressed on the pad, so that the pad is deformed and accordingly is closely contacted with the valve member. Thus, the leakage of the negative pressure is more reliably prevented. In addition, the opening and closing valve recited in any one of the ninth to eleventh features (9) to (11) is operated such that the valve member is pressed, owing to the biasing action of the spring member, on the pad to prevent more reliably the leakage of the negative pressure. The valve member may be covered by a pad, in addition to, or in place of the valve seat being covered by a pad.

(14) According to a thirteenth feature of the present invention that includes the twelfth feature (12), the sealing member comprises an O-ring.

The O-ring may be one which is independent of the valve seat, or one which also functions as the valve seat. In addition, the O-ring may be one which is provided on the valve member, or one which is provided in the valve hole.

In the case where the O-ring is independent of the valve seat, the valve member contacts the O-ring when the valve member is seated on the valve seat provided in the valve hole to close the opening and closing valve. The valve member is pressed against the O-ring by the attraction applied to the valve member owing to the negative pressure or the biasing action of the spring member. The O-ring is elastically deformed and held in close contact with the valve member, so that the leakage of the negative pressure is assuredly prevented. The seating of the valve member on the valve seat defines the limit of elastic deformation of the O-ring, so that the O-ring is prevented from being excessively elastically deformed and the sealing function of the same is prevented from being lowered.

In the case where the O-ring functions as the valve seat, the O-ring is contacted with the valve member and the inner wall surface defining the valve hole. The valve member is seated, by the attraction applied thereto owing to the negative pressure or the biasing action of the spring member, on the O-ring while elastically deforming the same. Thus, the opening and closing valve is closed, and the leakage of the negative pressure is prevented by the O-ring.

(15) According to a fifteenth feature of the present invention that includes any one of the twelfth to fourteenth features (12) to (14), at least a surface of at least one of the valve member and the sealing member is formed of a sticking-preventing material.

Since at least a surface of at least one of the valve member and the sealing member is formed of a sticking-preventing material, the sticking-preventing material prevents a problem that the valve member is stuck to the sealing member, the opening and closing cannot be opened, and the PWB cannot be held. The sticking-preventing material may be a first material which is more chemically stable than a material used to form the sealing member, such as rubber or its analogous material; or a second material which has a lower friction coefficient than that of a material used to form the sealing member. The above first material is effective in preventing the valve member from being stuck to the sealing member in the case where the valve member is kept in contact with the sealing member for a long time. The above second material is effective in preventing the valve member from being stuck to the sealing member in the case where the valve member is contacted with, and separated from, the sealing member so frequently. In the case where only a surface of the valve member or the sealing member is formed of the sticking-preventing material, a layer of the sticking-preventing material is formed on a surface of a base material, and the sticking-preventing layer is formed of a material which is more chemically stable, or has a lower friction coefficient, than the base material. The sticking-preventing material may be polytetrafluoroethylene (PTFE), which is chemically stable and has a low friction coefficient.

(16) According to a sixteenth feature of the present invention that includes any one of the first to fifteenth features (1) to (15), the plurality of negative-pressure-supply holes open in the upper surface of the holding table, such that the respective openings of the negative-pressure-supply holes are substantially uniformly distributed and substantially regularly arranged.

Even though the distribution of a plurality of portions of a PWB that are to be held by a plurality of holding members may be irregular, those holding members can be attached to respective positions corresponding to appropriate ones of the negative-pressure-supply holes substantially uniformly and substantially regularly arranged, and can cooperate with each other to hold the PWB.

(17) According to a seventeenth feature of the present invention that includes any one of the first to sixteenth features (1) to (16), the holding member includes a shank portion which supports, at an upper end surface thereof, the printed wiring board; and a suction cup which is formed of a flexible material such as rubber and is attached to an upper end portion of the shank portion such that the suction cup surrounds the upper end surface of the shank portion and closely contacts the printed wiring board.

The suction cup prevents the leakage of the negative pressure through the interface between the holding member and the PWB, so that the holding member can more reliably hold the PWB.

(18) According to an eighteenth feature of the present invention that includes any one of the first to seventeenth features (1) to (17), a lower end portion of the holding member provides a seat portion which has a connection recess opening in a lower surface thereof such that an area of an opening of the connection recess in the lower surface is not less than two times larger than an area of the opening of the corresponding one negative-pressure-supply hole in the upper surface of the holding table.

A portion of the holding member that holds the PWB may be connected to a middle portion of the seat portion or a different portion of the seat portion than the middle portion.

The holding member can be attached to an arbitrary position on the holding table, within a range in which the connection recess of the holding member can be aligned with the opening of one negative-pressure-supply hole. Thus, the position where the holding member attached to the one negative-pressure-supply hole holds the PWB can be changed. That is, even if the holding table may not have a negative-pressure-supply hole at a position just corresponding to a portion of the PWB that is to be held by a holding member, that portion of the PWB can be held by a holding member which is attached to an appropriate one of the negative-pressure-supply holes. Thus, the total number of the negative-pressure-supply holes can be decreased.

BRIEF DESCRIPTION OF THE DRAWINGS

The above and other objects, features, advantages and technical and industrial significance of the present invention will be better understood by reading the following detailed description of preferred embodiments of the invention, when considered in connection with the accompanying drawings, in which.

DETAILED DESCRIPTION OF PREFERRED EMBODIMENTS

Figure 1:
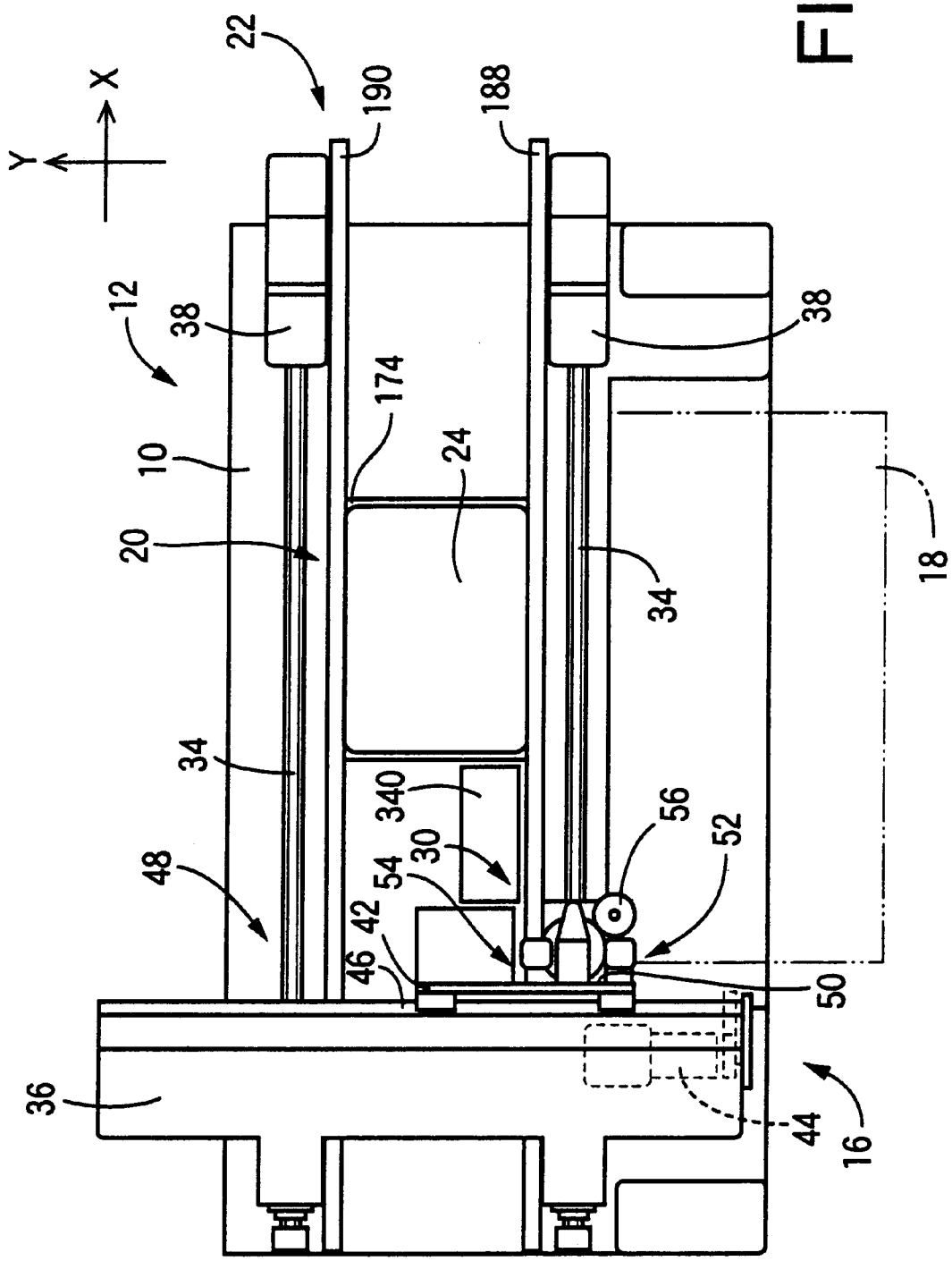
FIG. 1 is a schematic plan view of an electric-component (EC) mounting system including a printed-wiring-board (PWB) holding apparatus to which the present invention is applied.

Hereinafter, there will be described in detail an embodiment of the present invention as applied to a printed-wiring-board (PWB) holding apparatus employed in an electric-component (EC) mounting system, by reference to the drawings. In FIG. 1, reference numeral 10 designates a base as a main frame of an EC mounting system 12 as an operation performing system. On the base 10, there are provided an EC mounting device 16 as an operation performing device, an EC supplying device 18, and a PWB supporting and conveying device 20. The PWB supporting and conveying device 20 includes a PWB conveyor 22 which extends in an X-axis direction (i.e., a left-right direction in FIG. 1) and which conveys a PWB 24 in the X-axis direction, and positions and supports the PWB 24 at a prescribed EC-mount position where the PWB 24 is stopped by a stopper as a stopping device, not shown. The PWB supporting and conveying device 20 will be described in more detail later. The EC supplying device 18 is provided on one side of the PWB conveyor 22. Since, however, the EC supplying device 18 is not relevant to the present invention, no description thereof is made here.

The EC mounting device 16 has a construction similar to an EC mounting device disclosed in Japanese Patent No. 2,824,378, and accordingly it is briefly described here.

The EC mounting device 16 includes an EC mounting head 30 as an operation performing head that is linearly movable in each of the X-axis direction and a Y-axis direction perpendicular to the X-axis direction to convey an EC 32, in particular, an electronic component, and mount the same. To this end, on the base 10, there are provided, on both sides of the PWB conveyor 22 in the Y-axis direction, two ball screws 34 which extend parallel to the X-axis direction and which are threadedly engaged with two nuts, not shown, fixed to an X-axis table 36. When the ball screws 34 are rotated by respective X-axis-table drive motors 38, the X-axis table 36 is moved in the X-axis direction. On the bed 10, there are provided two guide rails as guide members, not shown, below the two ball screws 34, and the movement of the X-axis table 36 is guided by the two guide rails and two guide blocks as guided members, not shown, fixed to the table 36 such that the two guide blocks slide on the two guide rails, respectively.

The X-axis table 36 supports a ball screw 40 (FIG. 2) which extends parallel to the Y-axis direction and which is threadedly engaged with a nut, not show, fixed to a Y-axis table 42. When the ball screw 40 is rotated by a Y-axis-table drive motor 44 (FIG. 1), the Y-axis table 42 is moved while being guided by two guide rails 46 as guide members. Thus, the nuts, the ball screws 34, the X-axis table 36, and the X-axis-table drive motors 38, and, the nut, the ball screw 40, the Y-axis table 42, and the Y-axis-table drive motor 44 cooperate with each another to provide an X-Y robot 48 which moves the EC mounting head 30 in directions parallel to a surface of the PWB 24. The PWB 24 is horizontally conveyed, positioned, and supported, and the EC mounting head 30 is moved by the X-Y robot 48 to an arbitrary position on a horizontal plane.

Figure 2:
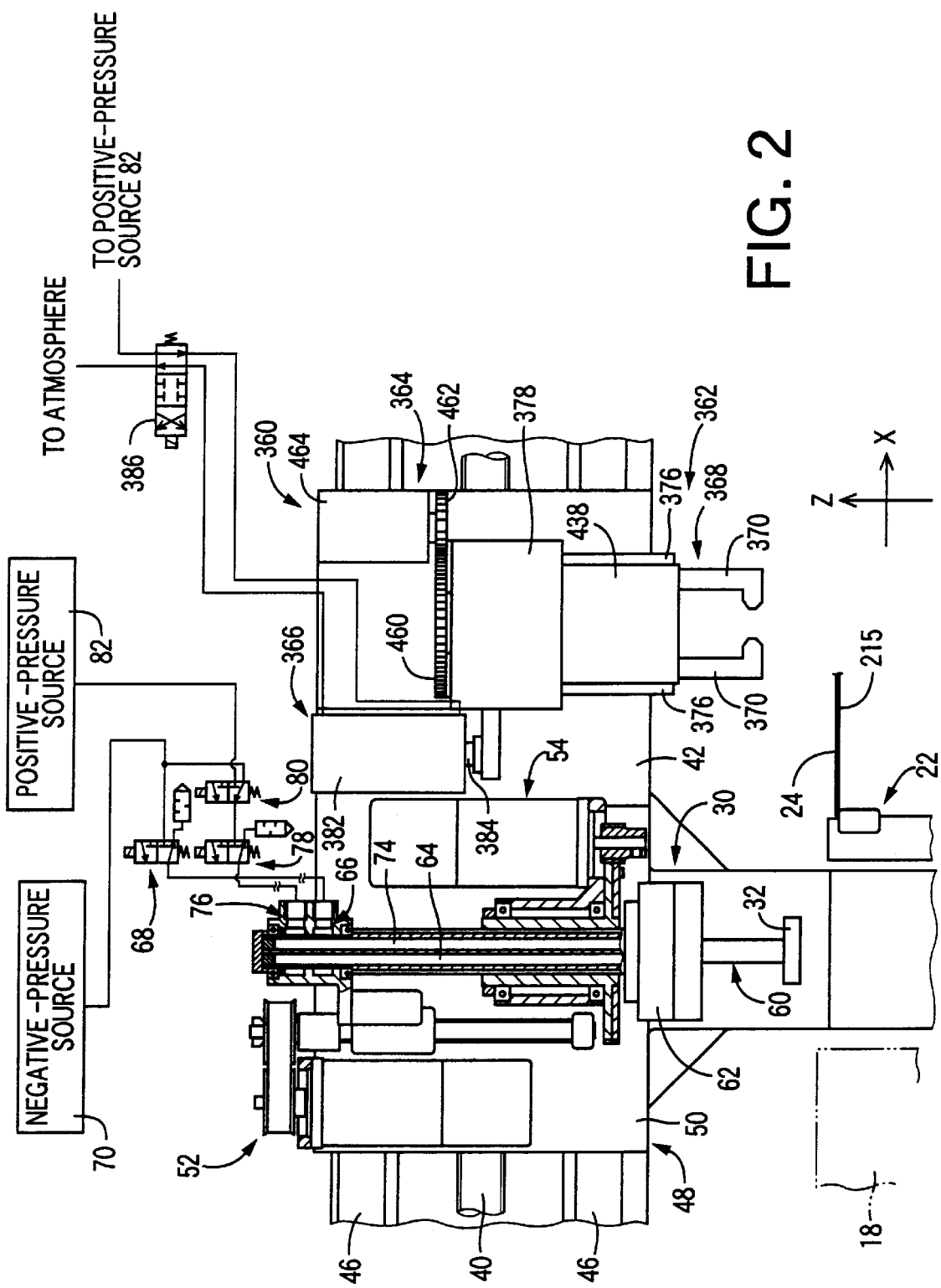
FIG. 2 is a side elevation view of an EC mounting device of the EC mounting system that includes an EC mounting head, a transferring unit, and a Y-axis table supporting the EC mounting head and the transferring unit.

On the X-axis table 36, there is provided a CCD (charge-coupled device) camera as an image taking device, below the Y-axis table 42, at a position between the EC supplying device 18 and the PWB supporting and conveying device 20 in the Y-axis direction. The CCD camera takes an image of the EC 32 held by the EC mounting head 30. Since, however, this CCD camera is not relevant to the present invention, no description thereof is made here. As shown in FIG. 2, the EC mounting head 30 is attached to a vertical side surface 50 of the Y-axis table 42, such that the head 30 is movable upward and downward and is rotatable. The side surface 50 supports an elevating and lowering device 52 which elevates and lowers the head 30; a rotating device 54 which rotates the head 30 about its centerline; and a CCD camera 56 (FIG. 1) as an image-taking device that takes an image of each of a plurality of reference marks provided on the PWB 24. The CCD camera 56 is not shown in FIG. 2.

As shown in FIG. 2, the EC mounting head 30 includes a suction nozzle 60 as a sort of component holder that sucks and holds the EC 32, and a nozzle holder 62 which holds the suction nozzle 60 such that the nozzle 60 is detachable from the holder 62. The nozzle holder 62 is moved by the X-Y table 48 to an arbitrary position on the horizontal plane. In the present embodiment, the nozzle holder 62 applies a suction or a negative pressure to the suction nozzle 60 and thereby holds the nozzle 60. To this end, the nozzle holder 62 is connected to a negative-pressure supply source 70 and the atmosphere via an air passage 64, a rotary valve 66, and a solenoid-operated direction-switch valve 68 and, when the direction-switch valve 68 is switched, the holder 62 is selectively communicated with the supply source 70 or the atmosphere, so that the holder 62 holds or releases the nozzle 60. In addition, the suction nozzle 60 is connected to the negative-pressure supply source 70, a positive-pressure supply source 82, and the atmosphere via an air passage 74, a rotary valve 76, and two solenoid-operated direction-switch valves 78, 80 and, when the direction-switch valves 78, 80 are switched, the nozzle 60 is selectively communicated with the negative-pressure supply source 70, the positive-pressure supply source 82, or the atmosphere. The suction nozzle 62 applies a negative air pressure to the EC 32 and thereby holds it, and applies a positive air pressure to the EC 32 and thereby releases it. The negative-pressure supply source 70 may be a negative-pressure supplying device or an air sucking device, and the positive-pressure supply source 82 may be an air supplying device which supplies an air having a positive pressure. In the present embodiment, the direction-switch valves 68, 78, 80 are provided on the Y-axis table 42, and the valves 68, 80 are connected to the negative-pressure supply source 70 and the positive-pressure supply source 82 via respective connectors, not shown, provided on the Y-axis table 42.

Figure 3:
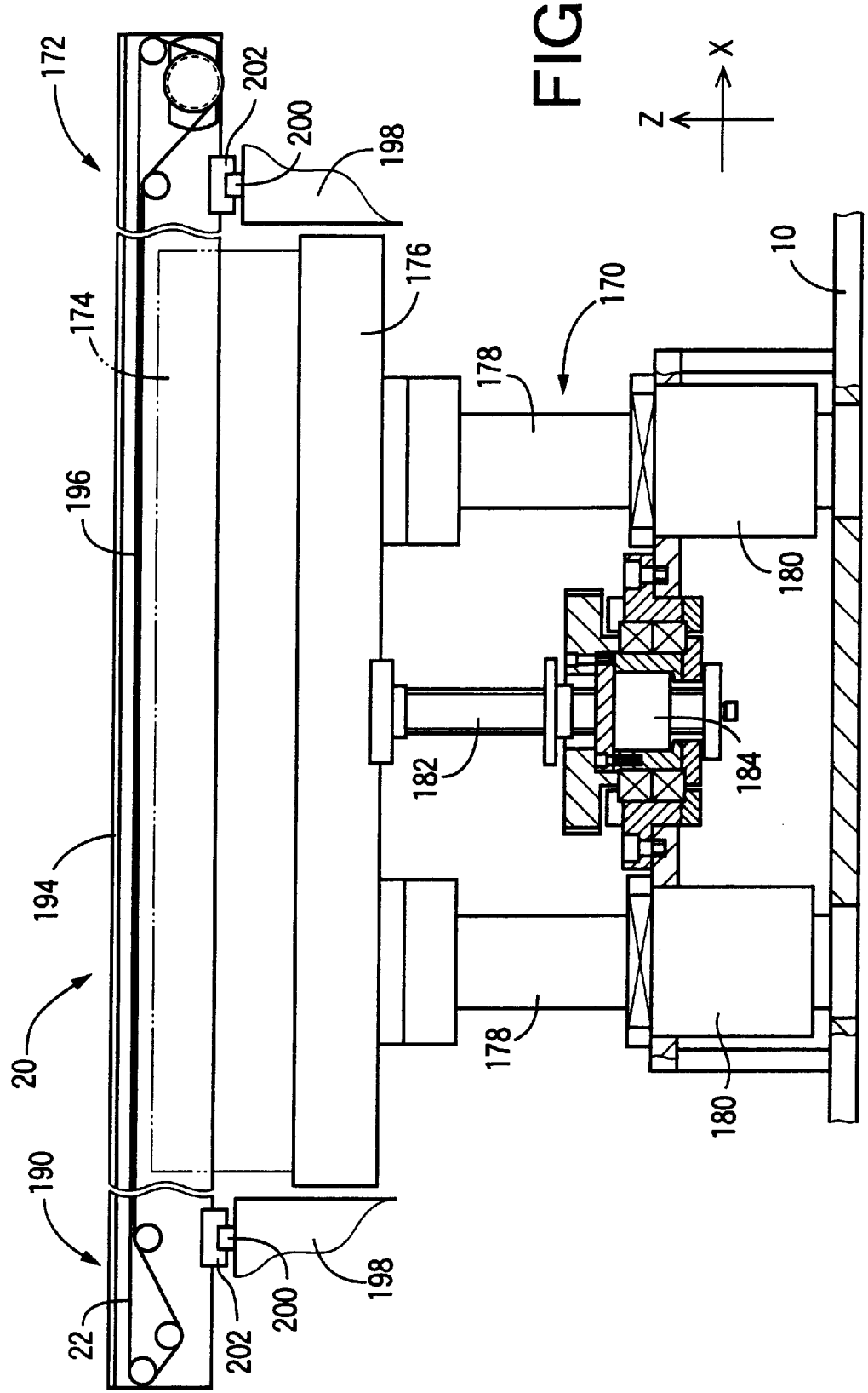
FIG. 3 is a partly cross-sectioned, front elevation view of a PWB supporting and conveying device including the PWB holding apparatus.

As shown in FIG. 3, the PWB supporting and conveying device 20 includes a PWB elevating and lowering device 170, a PWB clamping device 172, and a PWB holding apparatus 174. The PWB elevating and lowering device 170 includes a PWB lifter 176. Two guide rods 178 extend downward from a lower surface of the PWB lifter 176, and fit in two guide sleeves 180, respectively, fixed to the base 10, such that the lifter 176 is movable upward and downward. A ball screw 182 is fixed to the lower surface of the lifter 176, and is threadedly engaged with a nut 184 which is attached to the base 10 such that the nut 184 is rotatable about a vertical axis line and is not movable in an axial direction thereof. When the nut 184 is rotated by an elevating and lowering motor 186 (FIG. 12), the ball screw 182 is moved upward and downward, so that the PWB lifter 176 is moved upward and downward.

As shown in FIG. 1, the PWB clamping device 172 includes a fixed guide 188 and a movable guide 190 which extend parallel to a PWB-convey direction (i.e., the X-axis direction). Two conveyor belts 196 of the PWB conveyor 22 are supported by respective surfaces of the fixed and movable guides 188, 190 that are opposed to each other, and cooperate with each other to convey the PWB 24. As shown in FIG. 3, an upper end portion of the movable guide 190 provides a PWB hold-down portion 194 which somewhat projects inward toward another PWB hold-down portion 194 which is provided by an upper end portion of the fixed guide 188. Those PWB hold-down portions 194 are slightly spaced from an upper surface of the PWB 24 placed on the conveyor belts 196 as conveyor members of the PWB conveyor 22.

The opposed surfaces of the fixed and movable guides 188, 190 support respective clamping plates as movable clamping members that cooperate with the PWB hold-down portions 194 to clamp the PWB 24. The two clamping plates have an elongate shape parallel to a lengthwise direction of the fixed and movable guides 188, 190, and are normally biased by respective springs as biasing devices such that the clamping plates are held at an unclamping position where the clamping plates are spaced from the PWB hold-down portions 194 and are positioned below the conveyor belts 196. When the PWB 24 is clamped, a plurality of clamping cylinders as drive devices move the clamping plates toward the PWB hold-down portions 194 so that the clamping plates cooperate with the hold-down portions 194 to clamp opposite end portions of the PWB 24. In the present embodiment, the PWB hold-down portions 194, the clamping plates, the springs, and the clamping cylinders cooperate with one another to provide the PWB clamping device 172.

The base 10 supports the movable guide 190 such that the movable guide 190 is movable in a direction perpendicular to the PWB-convey direction, i.e., in the Y-axis direction. As shown in FIG. 3, two guide rails 200 as guide members that extend in the direction perpendicular to the PWB-convey direction on the horizontal plane are provided on respective upper-end surfaces of two support blocks 198 fixed to the base 10. Two guide blocks 202 as guided members that are fixed to a lower surface of the movable guide 190 fit on the two guide rails 200, such that the movable guide 190 is movable on the rails 200. The movable guide 190 is moved by a moving device or a conveyor-width changing device, not shown, including a feed screw, a nut, and a PWB-convey-width changing motor as a drive source, so that the movable guide 190 is moved toward, and away from, the fixed guide 188. Thus, a PWB-convey width corresponding to a width of the PWB 24 conveyed by the PWB conveyor 22 is automatically changed. However, it is possible to modify the present embodiment in such a manner that the PWB-convey width may be manually changed by an operator.

Figure 4:
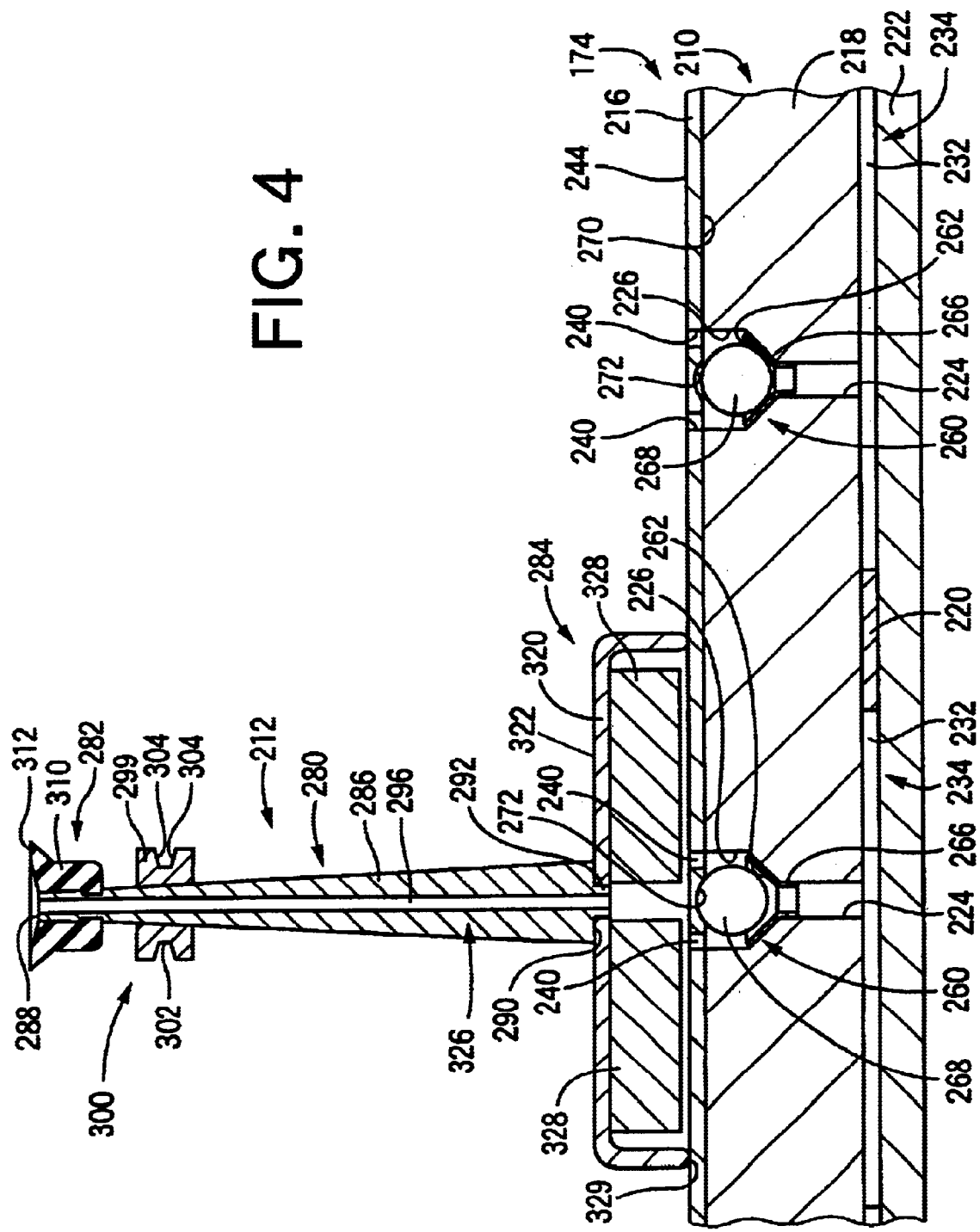
FIG. 4 is a cross-sectioned, front elevation view of a relevant portion of the PWB holding apparatus.
Figure 6:
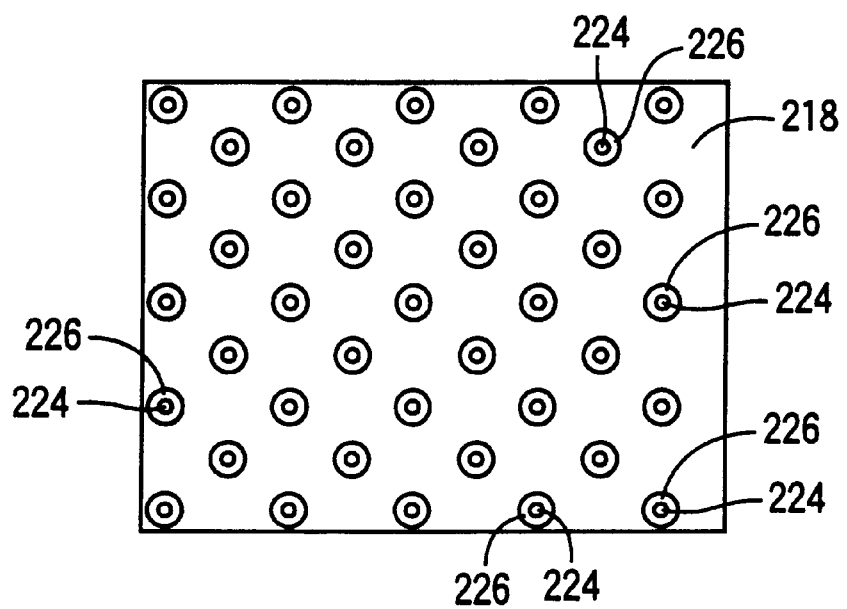
FIG. 6 is a plan view of a base as part of a holding table of the PWB holding apparatus.

The PWB holding apparatus 174 is provided on the PWB lifter 176, and is elevated and lowered by the PWB elevating and lowering device 170. As shown in FIG. 4, the PWB holding apparatus 174 includes a holding table 210, and a plurality of backup pins 212 each as a sort of holding pin as a holding member that are attachable to the holding table 210, and applies negative pressure to a back surface 215 (FIG. 2) of the PWB 24 and thereby holds the same 24. The holding table 210 includes a coming-off preventing plate 216, a base 218, a spacer 220, and a cover 222 which are superposed on one another. The base 218 as a main member of the holding table 210 has a plate-like shape, and is formed of a non-magnetic material such as aluminum. The base 218 has a plurality of negative-pressure supply holes 224 which are formed through the thickness thereof and open in each of the upper and lower surfaces thereof. Each supply hole 224 is a stepped hole including a small-diameter portion on the side of the spacer 220 and a large-diameter portion on the side of the coming-off preventing plate 216. The large-diameter portion of each supply hole 224 provides a valve hole 226. The supply holes 224 are arranged as shown in FIG. 6.

The spacer 220 has a thin-plate-like shape having a plurality of openings 232 which are formed through the thickness thereof in respective portions thereof corresponding to the respective negative-pressure supply holes 224 of the base 218. The cover 222 also has a plate-like shape and cooperates with the base 218 to sandwich the spacer 220, so that opposite ends of each of the openings 232 of the spacer 220 are closed to provide a communication passage 234.

The cover 222 has a plurality of communication holes (not shown) which are formed through the thickness thereof and communicate with the respective communication passages 234 of the spacer 220. The holding table 210 is fixed to the PWB lifter 176 by a fixing device, not shown, and, in this state, the communication holes of the cover 222 are connected to respective passages, not shown, formed in the lifter 176, and are eventually connected to the negative-pressure supply source 70 via those passages. Between those passages and the supply source 70, there is provided a switch-valve device, not shown, which is switchable to selectively communicate the supply holes 224 with the supply source 70 or the atmosphere.

In the present embodiment, the coming-off preventing plate 216 is formed of a ferromagnetic material such as steel, has a thin-plate-like shape, and is superposed on the upper surface of the base 218. In the present embodiment, the preventing plate 216 has substantially the same size as that of the base 218, and accordingly covers all the valve holes 226 of the base 218. The preventing plate 216, the base 218, the spacer 220, and the cover 222 are fixed to one another in such a manner that respective outer peripheral portions of the elements 216, 218, 220, 222, free of the communication passages 234, are fixed to one another by a fixing device such as bolts, not shown. The thus fixed elements 216, 218, 220, 222 function as the integral holding table 210.

Figure 5:
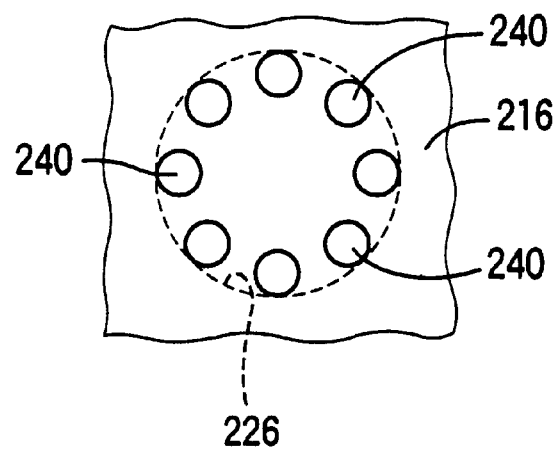
FIG. 5 is a plan view showing a plurality of communication holes which are formed in a coming-off preventing plate of the PWB holding apparatus.
Figure 14:
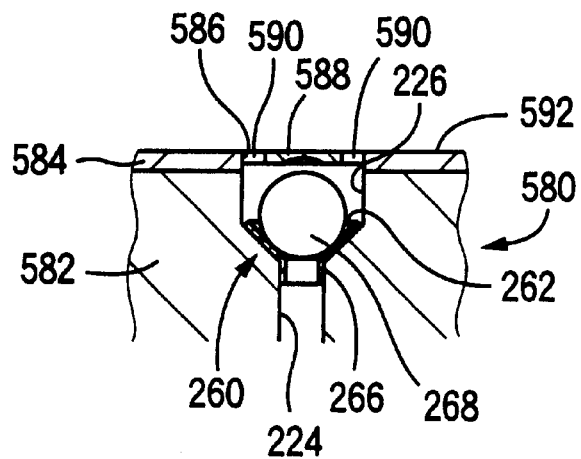
FIG. 14 is a cross-sectioned, front elevation view of another coming-off preventing member which may be employed in the PWB holding apparatus.

Each of respective portions of the coming-off preventing plate 216 that correspond to the valve holes 226 of the base 218 has a plurality of communication holes 240 at respective positions offset from the centerline of the corresponding valve hole 226. As shown in FIG. 5, those communication holes 240 are located along a circle whose center coincides with the centerline of the valve hole 226, such that the communication holes 240 are equiangularly spaced from each other about the center of the circle. Each communication hole 240 has a circular transverse cross section, and has a diameter smaller than that of the valve hole 226. However, the coming-off preventing plate 216 and the base 218 of the holding table 210 may be replaced with a support plate 584 and a base 582 of a holding table 580 shown in FIG. 14. The base 582 is formed of a non-magnetic material, and the support plate 584 is formed of a ferromagnetic material, and is fixed to the base 582. The support plate 584 has a plurality of through-holes 586 formed in respective portions thereof corresponding to a plurality of valve holes 226 of the base 582, and a plurality of lid members 588 as coming-off preventing plates as coming-off preventing members are fitted in the respective through-holes 586 to cover the respective valve holes 226. Each of the lid members 588 is formed of a ferromagnetic material, and has a plurality of communication holes 590 similar to the communication holes 240. Thus, the coming-off preventing plate 216 employed in the present embodiment is equivalent to the integrated support plate 584 and lid members 588. Therefore, it can be said that the through-holes 586 define respective opening ends of the valve holes 226 of the holding table 580, and the valve holes 226 open in an upper surface 592 of the holding table 580 that is defined by an upper surface of the support plate 584, and that, likewise, the valve holes 226 of the holding table 210 open in an upper surface 244 of the holding table 210 that is defined by an upper surface of the coming-off preventing plate 216, and the negative-pressure supply holes 224 open in the upper surface 244 of the holding table 210.

The base 218, the spacer 220, and the cover 222 have a high degree of flatness like those employed in a PWB holding apparatus disclosed in Japanese Patent Documents No. 7-15189 and 7-15191. Similarly, the coming-off preventing plate 216 has a high degree of flatness, and accordingly the upper surface 244 of the holding table 210 enjoys a high degree of flatness. In the present embodiment, a surface of the PWB lifter 176 to which the PWB holding apparatus 174 is fixed is horizontal, and the holding table 210 is detachably fixed by a fixing device, not shown, to the lifter 176 such that the upper surface 244 of the holding table 210 is horizontal.

As shown in FIG. 4, a open-and-close valve 260 is provided in each of the negative-pressure supply holes 224.

A bottom surface of the valve hole 226, located between the large-diameter and small-diameter portions of the each supply hole 224, is tapered such that the diameter of the tapered bottom surface gradually decreases in a direction toward the small-diameter portion, i.e., in a downward direction. The tapered bottom surface provides an upward facing valve seat 262. This means that the valve seats 262 of the base 218 are formed of aluminum as the non-magnetic material. Each of the valve seats 262 is covered by a pad 266 which is formed of a synthetic resin as a sort of material that is softer than aluminum. A ball 268 as a spherical member as a valve member is provided in each of the valve holes 226. The ball 268 has a diameter smaller than that of the valve hole 226, and is movable in the valve hole 226. In the present embodiment, the ball 268 is formed of a ferromagnetic material such as steel. The coming-off preventing plate 216 has, in respective portions of a lower surface 270 (i.e., a surface on the side of the valve holes 226), respective positioning recesses 272 which correspond to the respective valve holes 226 and each of which is located inside the communication holes 240. Each positioning recess 272 has a part-spherical inner surface corresponding to an outer spherical surface of each ball 268.

Next, the backup pins 212 will be described.

Figure 9:
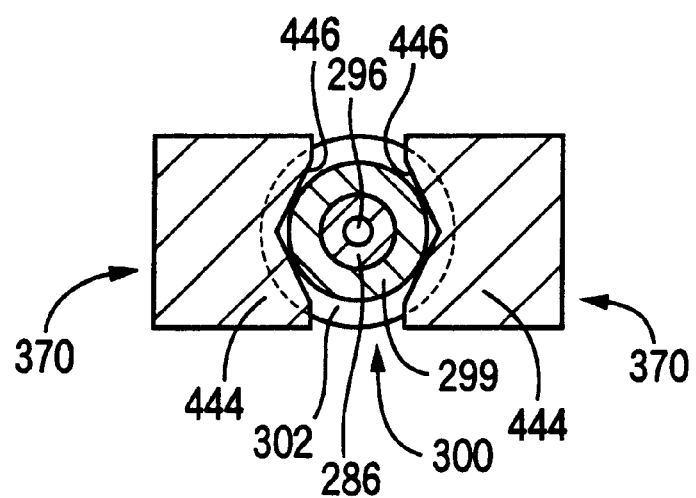
FIG. 9 is a cross-section view taken along 9—9 in FIG. 7.

As shown in FIG. 4, each backup pin 212 includes a pin portion 280 as a shank portion, a cup portion 282, and a seat portion 284. A pin 286 functioning as the pin portion 280 has a circular cross section, and is tapered such that its diameter decreases toward its free end (i.e., its upper end). A free or upper end surface of the pin 286 provides a support surface 288. The pin 286 has, at the center of a lower surface 290 thereof, a projection 292 having a circular cross section, and additionally has a passage 296 which is formed therethrough in an axial direction thereof and opens in each of the support surface 288 and an end surface of the projection 292. A neck member 299 as an engageable member is fixed, by an appropriate fixing means or manner, such as brazing, to a portion of the pin 286 that is near to its upper end, and provides a neck portion 300 as an engageable portion. As shown in FIG. 9, the neck portion 300 has a circular cross section, and has a circular groove 302 at an intermediate portion thereof as viewed in the axial direction of the pin 286. As shown in FIG. 4, the circular groove 302 has a trapezoidal cross section taken in the axial direction of the pin 286. A pair of side surfaces 304 defining the groove 302 are inclined such that a distance between the two side surfaces 304 increases in a radially outward direction.

A suction cup 310 fits on an upper end portion of the pin portion 280, such that the suction cup 310 is detachable from the pin portion 280 but is not easily pulled off the same 280. The suction cup 310 provides the cup portion 282. In the present embodiment, the suction cup 310 is formed of rubber, and has a diameter greater than that of the support surface 288. An upper portion of the cup 310 projects upward from the support surface 288, and an upper surface of the cup 310 provides a contact surface 312 which has a flat, annular shape whose diameter is greater than that of the support surface 288, surrounds the support surface 288, and faces upward.

Figure 13:
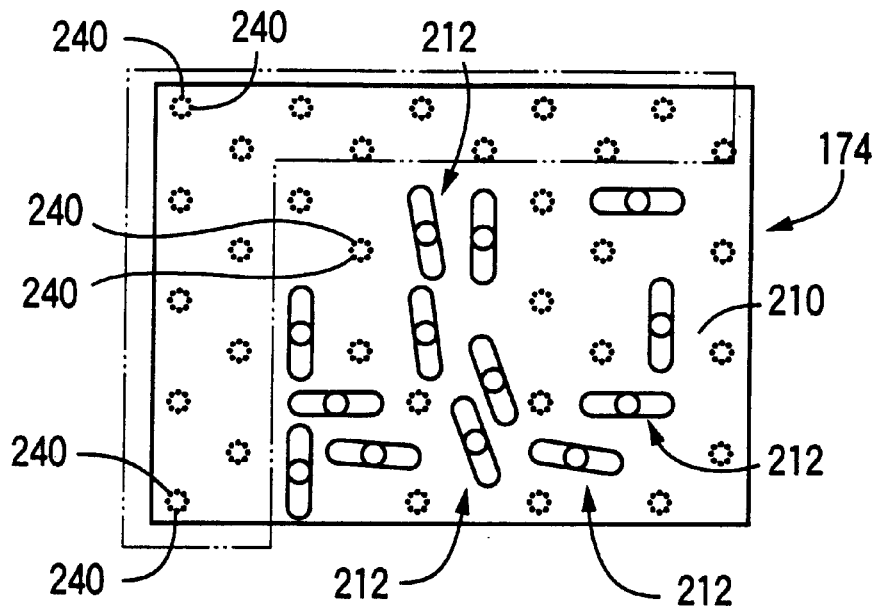
FIG. 13 is a view for explaining a manner in which the backup pin is attached to the holding table as part of the PWB holding apparatus.

A seat member 320 as an attached member is fixed to a lower end portion of the pin 286 that has the greatest diameter. The seat member 320 provides the seat portion 284. As shown in FIGS. 4 and 13, the seat member 320 has an elongate container-like shape, and a width of an inner space of the seat member 320 is somewhat greater than the diameter of the valve hole 226 and a length of the inner space is not less than two times greater than the width thereof. An end surface, i.e., a lower surface of the seat member 320 provides an annular seat surface 329, and the inner space of the seat member 320 provides a connection recess which has an opening in the seat surface 329. An area of the opening of the connection recess is not less than two times greater than an area of an opening of the valve hole 226 in the upper surface 244 of the holding table 210. The projection 292 of the pin 286 externally fits in a lengthwise middle portion of an upper wall 322 of the seat member 320, such that the pin 286 extends perpendicularly to the seat surface 329, and is fixed to the wall 322 by an appropriate fixing means or manner, such as brazing. The connection recess opens in the seat surface 329 opposite to the wall 322 to which the pin 286 is fixed, and the passage 296 of the pin portion 280 is communicated with the inner space, i.e., connection recess, of the seat member 320. Two permanent magnets 328 are provided in the inner space of the seat member 320, such that the two magnets 328 are fixed to respective portions of the wall 322 on both sides of the passage 296. Thus, a portion of the backup pin 212 in the vicinity of its lower end surface is formed of a permanent magnet, and the passage 296 is communicated with the middle portion of the inner space of the seat member 320. Each of the permanent magnets 328 has a rectangular parallelepiped shape, and has a thickness somewhat smaller than a depth of the seat member 320, so that the each magnet 328 is located inward of the seat surface 329. A width of each magnet 328 is somewhat smaller than that of the inner space of the seat member 320, and a small clearance is left between the each magnet 328 and opposite side walls of the seat member 320. In the present embodiment, the passage 296 formed in the pin 286 and the clearances left between the permanent magnets 328 and the side walls of the seat member 320 cooperate with each other to provide a negative-pressure passage 326 which extends from the lower end surface of the backup pin 212, provided by the seat surface 329 of the pin 212, to the opposite, support surface 288 thereof, through the entire length thereof.

As shown in FIG. 1, a backup-pin storing device 340 (hereinafter, referred as the storing device 340) as a holding-member storing device is provided adjacent to the PWB holding apparatus 174. The storing device 340 includes a supporting or storing table, not shown, which supports and stores a plurality of backup pins 212. In the present embodiment, at least a surface portion of the supporting table that supports the backup pins 212 is formed of steel as a sort of ferromagnetic material. Therefore, when a backup pin 212 is placed on a portion of the supporting table, that portion of the supporting table is magnetized, and the backup pin 212 is fixed to, and stored on, the supporting table.

The storing device 340 holds a plurality of backup pins 212 such that each of the backup pins 212 takes a vertical posture oriented upward. The support surface of the storing device 340 that supports the backup pins 212 takes the same height position as that of the upper surface 244 of the holding table 210 of the PWB holding apparatus 174 being positioned at its downward-movement-end position. Therefore, the backup pins 212 stored on the storing device 340 take the same height position as that of one or more backup pins 212 attached to the holding table 210 being positioned at its downward-movement-end position. In the present embodiment, it is assumed that all PWBs 24 have a same thickness and all pickup pins 212 have a same height (i.e., a distance between its seat surface 329 and its support surface 288). In addition, the storing device 340 is provided on the side of the fixed guide 188 (i.e., on the side of the EC supplying device 18), and has a width (i.e., a dimension in a direction parallel to the Y-axis direction) somewhat smaller than a minimum distance between the fixed and movable guides 188, 190, so that the storing device 340 does not interfere with the movable guide 190.

Figure 7:
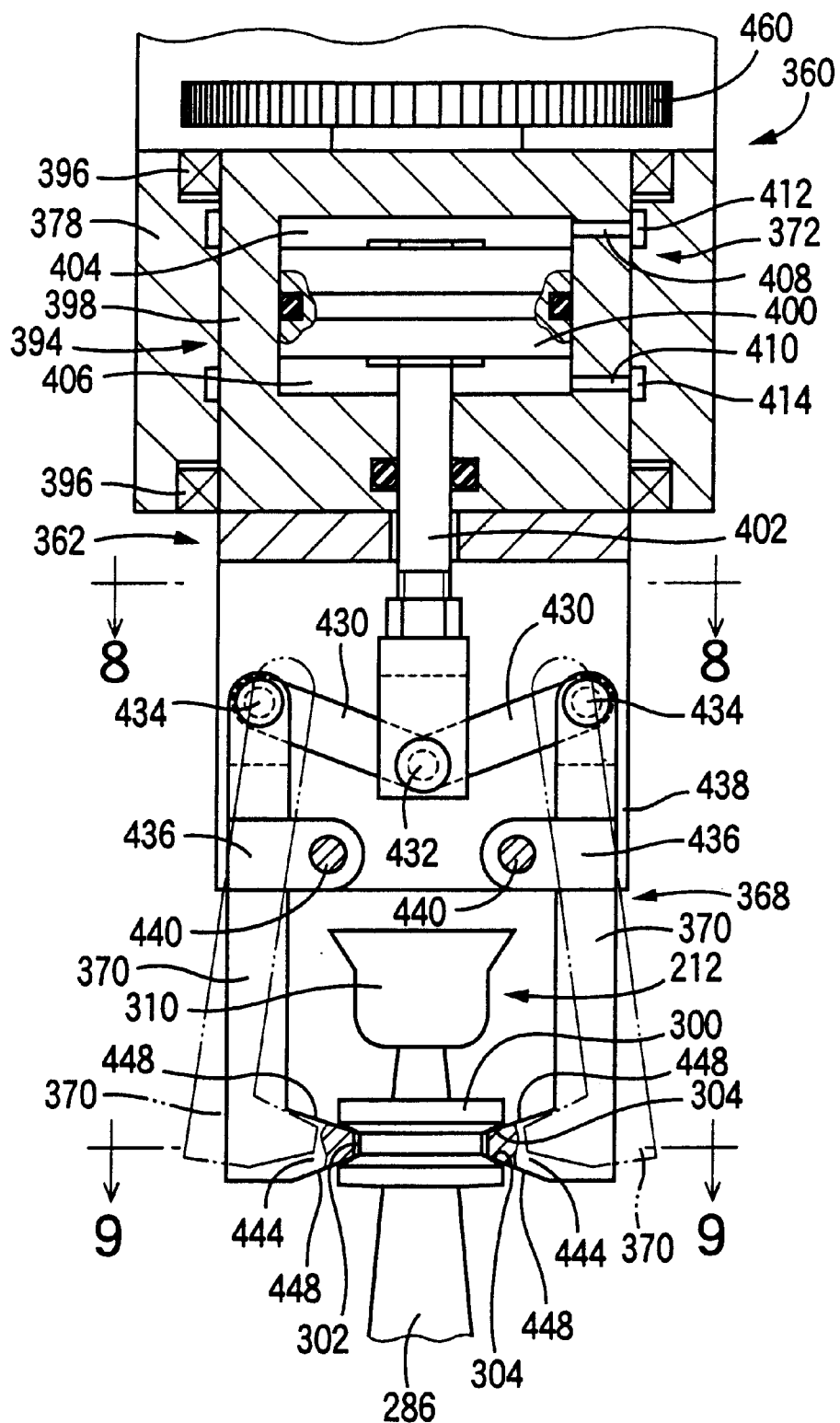
FIG. 7 is a partly cross-sectioned, side elevation view of a transferring head of an automatic resetting device which attaches a backup pin as part of the PWB holding apparatus to the holding table.

In the present embodiment, the attachment and detachment of each backup pin 212 to and from the holding table 120 are automatically performed by utilizing the X-Y robot 48 of the EC mounting device 16. To this end, as shown in FIGS. 2 and 7, the Y-axis table 42 supports a transferring unit 360 which includes a transferring head 362; a rotating device 364 which rotates the transferring head 362 about a vertical axis line perpendicular to the upper surface 244 of the holding table 210; and an elevating and lowering device 366 which elevates and lowers the transferring head 362. The transferring head 362 includes a pin holder 368 as a holding-member holder; and a finger drive device 372 (FIG. 7) which opens and closes a pair of grasping fingers 370 as part of the pin holder 368. The transferring unit 360 is moved, by the X-Y robot 48, relative to the holding table 210, in directions parallel to the horizontal upper surface 244 of the holding table 210, and cooperates with the X-Y robot 48 to provide a mechanical portion of an automatic resetting apparatus. The mechanical portion cooperates with a portion of a control device 500, described later, that controls the mechanical portion, the storing device 340, and so on to provide a backup-pin attaching apparatus as a holding-member attaching apparatus or the automatic resetting apparatus which automatically resets the PWB holding apparatus 174.

Figure 10:
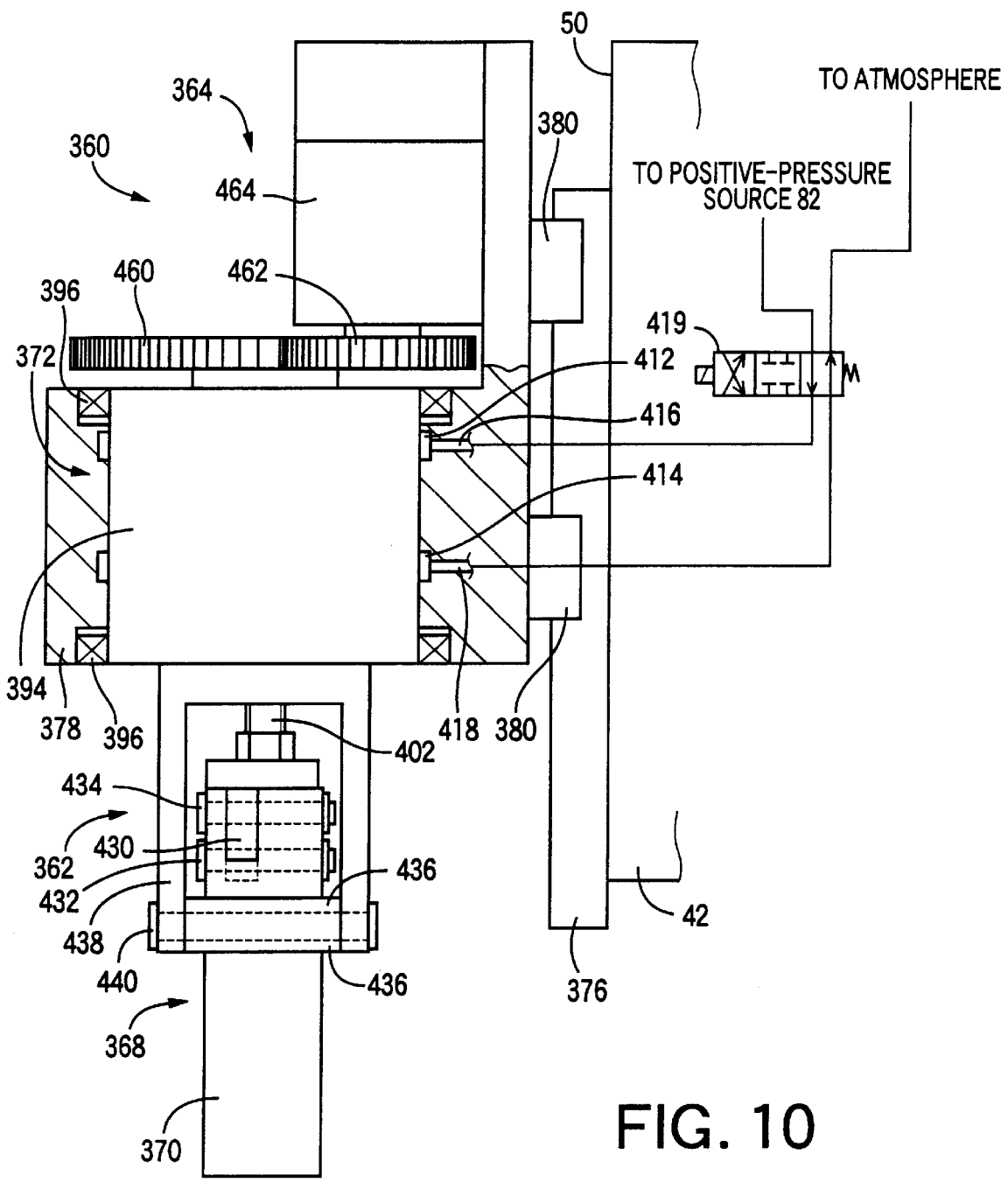
FIG. 10 is a partly cross-sectioned, rear elevation view of the transferring unit including the transferring head.
Figure 11:
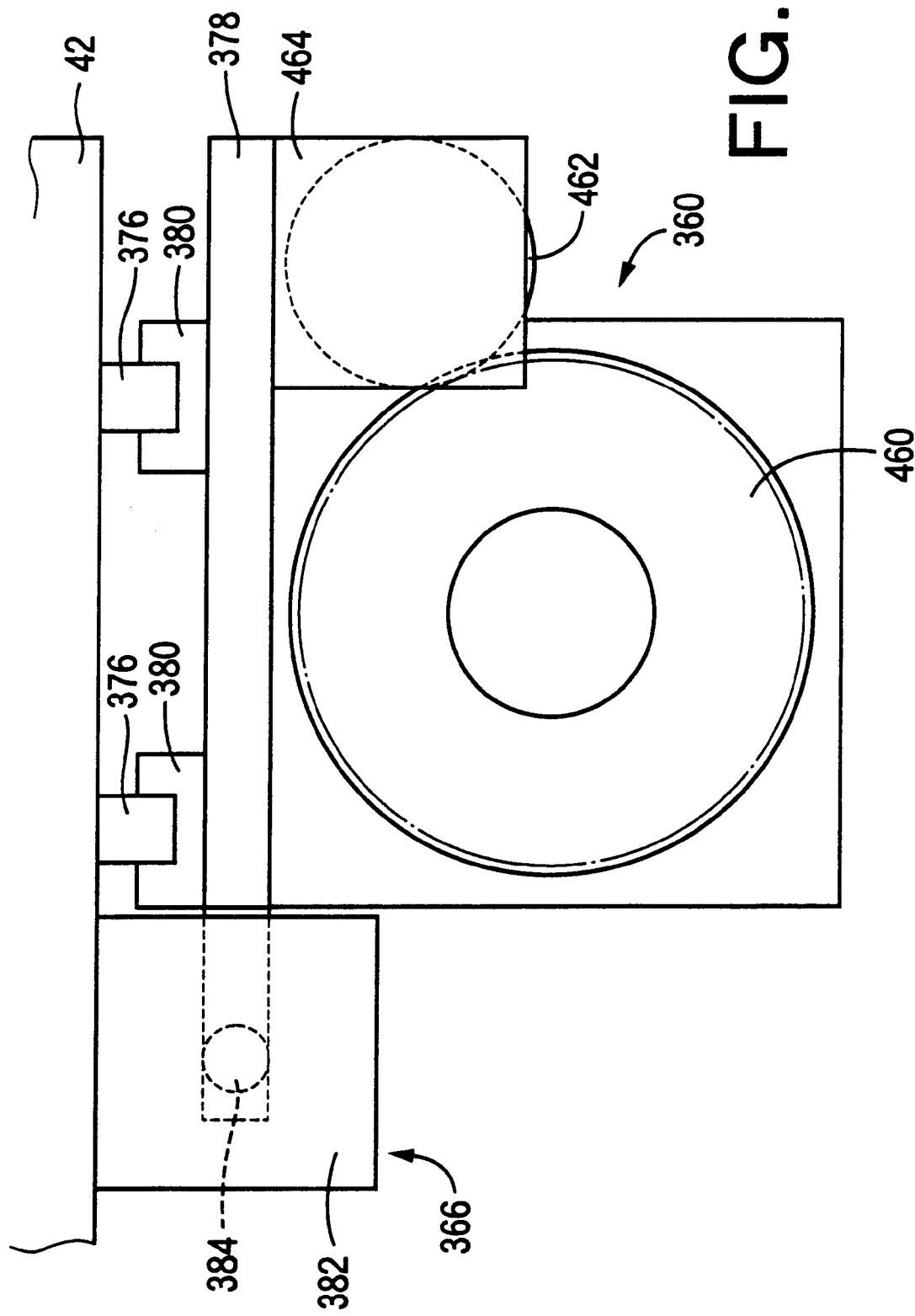
FIG. 11 is a plan view of a mechanical portion of the resetting device.

As shown in FIGS. 2 and 10, the vertical side surface 50 of the Y-axis table 42 supports a pair of guide rails 376 each as a guide member, such that the guide rails 376 are vertical, and an elevator table 378 fits via respective guide blocks 380 each as a guided member on the guide rails 376, such that the elevator table 378 is movable relative to the Y-axis table 42. In addition, the Y-axis table 42 supports a pressurized-air-operated cylinder device 382 as a pneumatic actuator as a sort of a pressurized-fluid-operated actuator as a drive source, such that the air-operated cylinder 382 is oriented downward. As shown in FIGS. 2 and 11, a piston rod 384 is engaged with the elevator table 378. Two air chambers of the air-operated cylinder 382 are selectively communicated with the positive-pressure source 82 and the atmosphere, respectively, or the atmosphere and the source 82, respectively, by a switching operation of a solenoid-operated direction-switch valve 386, so that the piston rod 384 is advanced or retracted and the elevator table 378 is lowered or elevated. Thus, the air-operated cylinder 382 and so on provides the elevating and lowering device 366. In the present embodiment, the direction-switch valve 386 is mounted on the Y-axis table 42, and is connected to the positive-pressure source 82 via the previously-described connector provided on the Y-axis table 42.

As shown in FIGS. 7 and 10, the elevator table 378 supports a pressurized-air-operated cylinder device 394 via bearings 396 such that the air-operated cylinder 394 is rotatable relative to the elevator table 378 about a vertical axis line and is not movable relative to the table 378 in an axial direction. A piston 400 liquid-tightly fits in a housing 398 of the air-operated cylinder 394, such that the piston 400 is movable in an axial direction. A piston rod 402 which is integral with the piston 400 projects downward from the piston 400, liquid-tightly through the wall of the cylinder housing 398, and extends out of the housing 398.

The piston 400 fits in the cylinder housing 398, so that two air chambers 404, 406 are provided on both sides of the piston 400, respectively, and are connected to the positive-pressure source 82 via respective ports 408, 410 formed in the housing 398, respective annular passages 412, 414 formed in the elevator table 378, respective passages 416, 418 (FIG. 10), and a solenoid-operated direction-switch valve 419. The direction-switch valve 419 is connected to the above-described connector and to the positive-pressure source 82. Thus, the two air chambers 404, 406 are communicated with the positive-pressure source 82 and the atmosphere, respectively, or vice versa, by a switching operation of the direction-switch valve 519, so that the piston 400 is moved and the piston rod 402 is advanced or retracted.

In the present embodiment, the various solenoid-operated direction-switch valves including the valve 68 are mounted on the Y-axis table 42, and the switching operations to switch the respective supplies of the positive pressure and the negative pressure to the various devices, including the EC mounting head 30, that are mounted on the Y-axis table 42 and need the positive pressure and the negative pressure are performed on the Y-axis table 42. Therefore, the distance between each of the direction-switch valves and a corresponding one of the devices that are operated based on the positive-pressure air or the negative pressure is short, and accordingly those devices exhibit a quick response.

Figure 8:
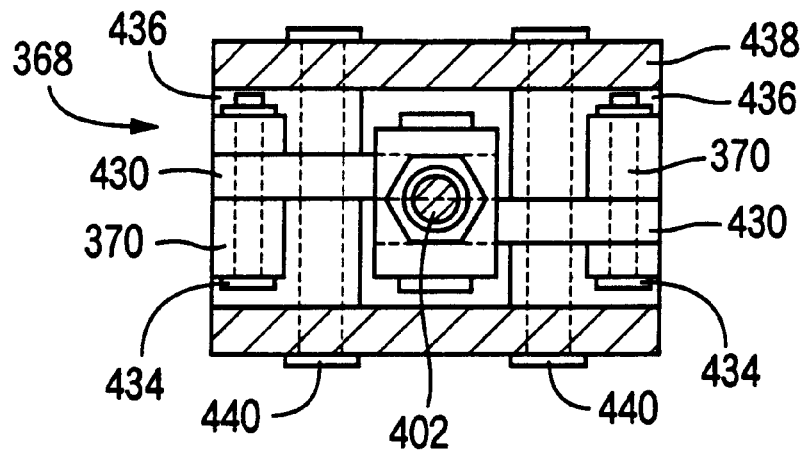
FIG. 8 is a cross-section view taken along 8—8 in FIG. 7.

As shown in FIG. 7, a pair of links 430 are attached, at respective one end portions thereof, to a lower end portion of the piston rod 402 via a pin 432, such that each of the links 430 is pivotable about a horizontal axis line. Respective other end portions of the links 430 are connected to the two grasping fingers 370 via respective pins 434, such that each of the fingers 370 is pivotable about a horizontal axis line. As shown in FIGS. 7 and 8, each of the two grasping fingers 370 includes an ear portion 436 at a position near to a corresponding one of the two links 430, and each of the respective ear portions 436 of the fingers 370 is pivotally connected to a corresponding one of two pins 440 supported by a bracket 438 which is integral with the cylinder housing 398.

Respective lower end portions of the two grasping fingers 370 are perpendicularly bent toward each other to provide respective engaging portions 444. As shown in FIG. 9, each of the engaging portions 444 has, at a free end thereof, a recess 446 having a V-shaped cross section. As shown in FIG. 7, an upper and a lower surface of each of the engaging portions 444 are inclined to provide respective inclined surfaces 448 each having an inclination corresponding to that of the inclined side surfaces 304 of the circular groove 302 of the neck portion 300 of the backup pin 212. The two grasping fingers 370 grasp the backup pin 212 in such a manner that the respective engaging portions 444 enter and engage the circular groove 302 of the neck portion 300. In the present embodiment, the respective pairs of inclined surfaces 448 of the two engaging portions 444 engage the side surfaces 304 of the annular groove 302, and thereby grasp the backup pin 212 without tilting the same 212. The recess 446 of each of the two engaging portions 444 defines a V-shaped space which assures that the inclined surfaces 448 engage the side surfaces 304, and thereby grasp the neck portion 300, or grasp the backup pin 212 with a small clearance being left between the surfaces 448 and the neck portion 300.

When the piston rod 402 is moved downward, the two grasping fingers 370 are pivoted, as indicated at two-dot-chain line, such that the respective engaging portions 444 are moved away from each other, so that the backup pin 212 is released. On the other hand, when the piston rod 402 is moved upward, the two grasping fingers 370 are pivoted, as indicated at solid line, such that the respective engaging portions 444 are moved toward each other, so that the backup pin 212 is grasped such that the backup pin 212 is coaxial with the axis line of the air cylinder 394, i.e., the axis line of the pin holder 368. Thus, the piston rod 402, the links 430, the grasping fingers 370, and the bracket 438 are so connected to one another that the grasping fingers 370 grasp and release the backup pin 212 owing to a toggle mechanism. Thus, the backup pin 212 is strongly grasped by the pin holder 438. In the present embodiment, the bracket 438 provides a main member of the pin holder 368 that cooperates with the links 430 and the grasping fingers 370 to provide the pin holder 368. The rotating device 364 which rotates the pin holder 368 is elevated and lowered with the holder 368 and so on. The air cylinder 394 and so on provide the finger drive device 372.

As shown in FIG. 7, a driven gear 460 is provided on an upper surface of the cylinder housing 398, such that the driven gear 460 is coaxial with the housing 398 and is not rotatable relative to the same 398. As shown in FIG. 11, the driven gear 460 is meshed with a drive gear 462 and, when the drive gear 462 is rotated by a rotating motor 464, the drive gear 462 is rotated, so that the air cylinder 394 is rotated about the vertical axis line and the pin holder 368 is rotated about the same vertical axis line. The rotating motor 464 are provided on the elevator table 378, and cooperates with the drive gear 462, the driven gear 460, and so on to provide the rotating device 364. The air chambers 404, 406 of the air cylinder 394 are supplied with the air via the respective annular passages 412, 414, so that even if the air cylinder 394 is rotated, the air chambers 404, 406 can continuously receive the air.

Figure 12:
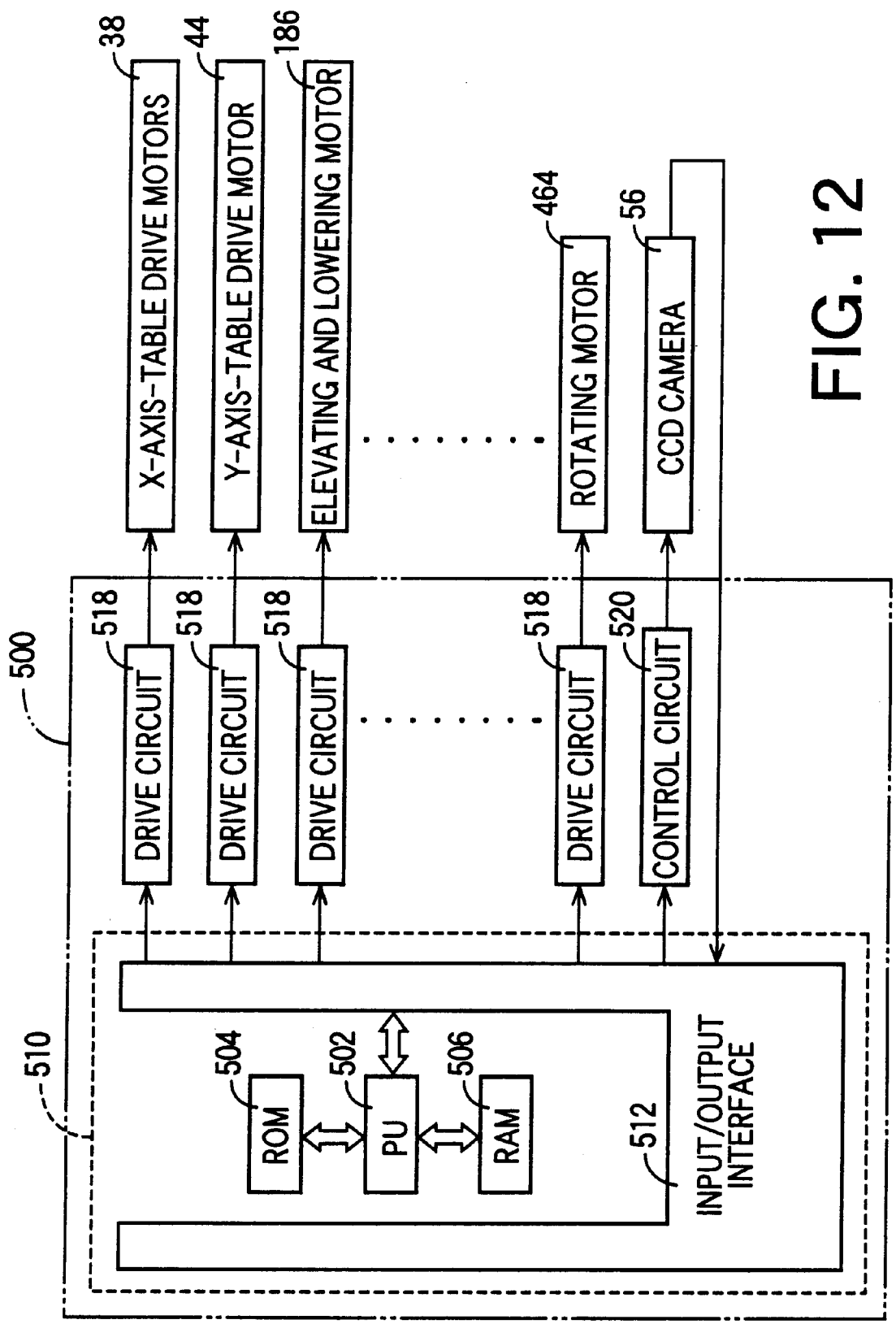
FIG. 12 is a diagrammatic view of a control device which controls the EC mounting system.

The present EC mounting system 12 is controlled by a control device 500 shown in FIG. 12. The control device 500 is essentially provided by a computer 510 including a PU (processing unit) 502, a ROM (read only memory) 504, a RAM (random access memory) 506, and a bus which connects those elements 502, 504, 506 to one another. An input/output interface 512 is connected to the bus, on one hand, and is connected, on the other hand, the various actuators including the X-axis-table drive motors 38, the Y-axis-table drive motor 44, the elevating and lowering motor 186 for elevating and lowering the PWB lifter 176, and so on, via respective drive circuits 518. In addition, the input/output interface 512 is connected via a control circuit 520 to the CCD camera 56. Image data representing the image taken by the CCD camera 56 are input to the computer 510. The motors employed in the present EC mounting system 12, such as the X-axis-table drive motors 38, are servomotors each as a sort of electric motor as a drive source. However, the servomotors may be replaced with a different sort of motors that can be controlled with respect to rotation amount or angle, e.g., stepper motors. The respective rotation angles of those motors are detected by respective encoders, not shown, each as a rotation detecting device.

The RAM 506 of the control device 500 includes a pin-setting-data memory which stores, for each of a plurality of sorts of PWBs 24, a batch of setting data that is needed to set backup pins 212. The setting data include horizontal-direction-position data representing respective horizontal-direction positions of the backup pins 212 where the respective axis lines of the pins 212 are to be placed on the holding table 210 in directions parallel to the horizontal upper surface 244 of the table 210; and rotation-position data representing respective angular or rotation positions of the backup pins 212 about the respective axis lines thereof with which the pins 212 are to be placed on the table 210. Each of the horizontal-direction positions is expressed by a set of x and y coordinates; and each of the rotation positions is expressed by, i.e., an angle of the lengthwise direction of the seat member 320 of a corresponding backup pin 212 as measured from a reference rotation position (i.e., an angle of 0 degree) parallel to the X-axis direction, in a clockwise or positive direction or in a counterclockwise or negative direction, under the condition that the backup pin 212 is seen from the side of the support surface 288 thereof. The ROM 504 stores various control programs including a program needed to mount the ECs 32 on the PWB 24, and a program needed to attach the backup pins 212 to the holding table 210. The PU 502 implements those control programs while utilizing the RAM 506.

In the present embodiment, a plurality of backup pins 212 are attached to the holding table 210, to suck the lower surface 215 of the PWB 24 and hold the same 24. In addition, when the PWB holding apparatus 174 is reset, the backup pins 212 are detached from the holding table 210 and are attached again to the same 210. Hereinafter, a manner in which the backup pins 212 are attached to the holding table 210 to suck and hold the PWB 24 will be described first.

The lower or back surface 215 of the PWB 24, opposite to the upper or front surface thereof on which ECs 32 are to be mounted, has some ECs 32 already mounted thereon and some uneven portions. Thus, each backup pin 212 must support one of limited portions of the back surface 215. Meanwhile, the holding table 210 is used commonly for a plurality of sorts of PWBs 24, and has a size greater than that of the largest one of the different sorts of PWBs 24. Thus, the backup pins 212 are not attached to all the negative-pressure-supply holes 224 and, as shown in FIG. 13, the holding table 210 includes a first area, indicated at two-dot-chain line, which is not aligned with the PWB 24 because the PWB 24 is smaller than the table 210 and to which no backup pins 212 are attached, and a second area which is aligned with the PWB 24 and includes first portions to which backup pins 212 are attached and second portions to which backup pins 212 are not attached.

As illustrated in the right-hand portion of FIG. 4, with respect to a negative-pressure-supply hole 224 to which a backup pin 212 is not attached, the ball 268 is seated, owing to its own weight, on the valve seat 262 and closes the open-and-close valve 260. On the other hand, with respect to a negative-pressure-supply hole 224 to which a backup pin 212 is attached, the seat surface 329 as the lower surface of the seat member 320 is closely contacted with a portion of the upper surface 244 of the holding table 210 that surrounds the opening of the hole 224. That is, the backup pin 212 is attached to the upper surface 244 such that the pin 212 is held in close contact with a portion of the upper surface 244 that surrounds the communication holes 240 provided at respective positions corresponding to the valve hole 226 of the negative-pressure-supply hole 224, and such that the seat member 320 covers the communication holes 240. Since the permanent magnets 328 are fixed to the seat member 320 and the coming-off preventing plate 216 is formed of steel as ferromagnetic material, the plate 216 is magnetized and accordingly the backup pin 212 is attracted and fixed to the holding table 210 by the magnetic force. In the present embodiment, the coming-off preventing plate 216 has substantially the same size as that of the base 218 and covers all the valve holes 226. When a backup pin 212 is placed on the holding table 210, a great magnetic force is produced by the permanent magnets 328 and the plate 216, so that the backup pin 212 is fixed with a great force to the table 210. Since the permanent magnets 328 are located inward of the seat surface 329 of the seat member 320, the seat surface 329 is closely contacted with the upper surface 244 to prevent leakage of the negative pressure. All the backup pins 212 have a same size, so that in a state in which three or more backup pins 212 are attached to the holding table 210, the respective support surfaces 288 of the backup pins 212 take a same height position and cooperate with one another to define a plane (e.g., a horizontal plane in the present embodiment).

Since the ball 268 as the valve member of the open-and-close valve 260 is formed of steel as ferromagnetic material and the base 218 in which the valve seat 262 is provided is formed of aluminum as non-magnetic material, the ball 268 is magnetized by the permanent magnets 328, but the valve seat 262 is not magnetized, so that the ball 268 is attracted by the coming-off preventing plate 216 and is moved away from the valve seat 262 and accordingly the open-and-close valve 260 is opened. However, the plate 216 prevents the ball 268 from coming off the valve hole 226. Since the coming-off preventing plate 216 with which the ball 268 is to be directly engaged is formed of ferromagnetic material and accordingly can be magnetized, a great magnetic force is exerted to the ball 268 so that the ball 268 is easily moved away from the valve seat 262. In addition, the ball 268 is partly accommodated in the positioning recess 272 formed in the plate 216, and accordingly is positioned relative to the communication holes 240 in a direction intersecting the directions in which the ball 268 is moved toward, and away from, the valve seat 262. Thus, the communication holes 240 are not closed by the ball 268, and accordingly the communication between the negative-pressure passage 326 and the negative-pressure supply hole 224 is maintained. In this state, the supply hole 224 is communicated with the passage 326 via the valve hole 226, and the communication holes 240 of the plate 216, so that the passage 326 is supplied with the negative pressure from the supply hole 224.

When the ECs 32 are mounted on the PWB 24, the PWB 24 is carried in by the PWB conveyor 22. At this time, the PWB holding apparatus 174 is held at its downward-movement-end position by the PWB elevating and lowering device 170, so that the PWB 24 is carried in onto the PWB holding apparatus 174, and contacted with, and stopped by, the stopper, not shown. Then, the holding apparatus 174 is moved upward to its upward-movement-end position by the elevating and lowering device 170. When the PWB lifter 176 is moved upward, the solenoid-operated direction-switch valve, not shown, is switched to communicate the negative-pressure-supply holes 224 with the negative-pressure source 70, so that the negative pressure is supplied to the backup pins 212. Thus, the backup pins 212 are moved upward while sucking and holding the PWB 24. Eventually, the backup pins 212 lift up the PWB 24 off the conveyor belts 196, and press the same 24 against the PWB hold-down portions 194. In the present embodiment, the distance of movement of the PWB holding apparatus 174 is equal to a value which is obtained by subtracting the thickness of the PWB 24 from the distance between the hold-down portions 194 and the support surfaces 288 of the backup pins 212 positioned at their downward-movement-end position. The suction cups 310 are elastically deformed while sucking and holding the PWB 24. In the state in which the holding apparatus 174 is positioned at its upward-movement-end position, the support surfaces 288 engage the PWB 24, cooperate with the hold-down portions 194 to sandwich the PWB 24, and support the lower surface 215 of the PWB 24. The contact surfaces 312 of the suction cups 310 closely contact the PWB 24, around the support surfaces 288, to prevent the leakage of the negative pressure. Even if the PWB 24 may warp such that the PWB 24 is upwardly convex, the convex portion of the PWB 24 is sucked by the backup pins 212 and is closely contacted with the support surfaces 288. Even if the PWB 24 may warp such that the PWB 24 is downwardly convex, the convex portion of the PWB 24 is lifted up by the backup pins 212 and is corrected to extend along a plane. Thus, the PWB holding apparatus 174 holds the PWB 24 such that the PWB 24 takes a horizontal posture.

After the PWB holding apparatus 174 is moved upward, the above-described clamping plates provided on the fixed and movable guides 188, 190 are moved upward by the clamping cylinders, so that the respective end portions of the PWB 24 are sandwiched and held by the clamping plates and the PWB hold-down portions 194.

During a time duration in which the ECs 32 are mounted on the PWB 24, the negative pressure is continuously supplied to the backup pins 212. Consequently the PWB 24 is sucked and held by the backup pins 212 and is kept horizontal, and the balls 268 of the opening and closing valves 260 present in the negative-pressure-supply holes 224 free of the backup pins 224 are seated, owing to their own weights, on the corresponding valve seats 262 and are pressed against the same 262 by the attractive forces applied thereto owing to the negative pressure. Since the valve seats 262 are covered by the pads 266, the pads 266 are deformed and are closely contacted with the balls 268, so that the negative-pressure-supply holes 224 are closed by the balls 268 and the leakage of the negative pressure is more effectively prevented.

After in this way the PWB 24 is held by the PWB holding apparatus 174, the X-Y robot 48 moves the CCD camera 56 to a plurality of positions at each of which the CCD camera 56 is opposed to a corresponding one of a plurality of reference marks provided on the PWB 24. Based on a batch of image data representing the taken images of the reference marks, the computer 510 determines positional errors of the PWB 24 held by the holding apparatus 174, and stores the determined positional errors in the RAM 506. Subsequently, the EC mounting head 30 picks up an EC 32 from the EC supplying device 18 and conveys the EC 32 to a position right above an EC-mount place on the PWB 24. During the conveying of the EC 32, the EC-image-taking CCD camera takes an image of the EC 32 held by the head 32 and, based on a batch of image data representing the taken image of the EC 32, the computer 510 determines positional errors of the EC 32 held by the head 32. Based on the positional errors of the PWB 24 and the positional errors of the EC 32, the computer 510 modifies the distance of movement of the EC 32, and controls the rotating device 54 to rotate the EC 32, so as to correct the positions error of the PWB 24 and the EC 32. The positional errors of the center of the EC 32 produced by correcting the rotation-position error of the EC 32 are also corrected by modifying the distance of movement of the EC 32. After this correcting step, the EC 32 is mounted, at a correct rotation position, at a correct EC-mount place on the PWB 24.

After the ECs 32 are mounted on the PWB 24, the clamping plates are moved down to release the PWB 24, and the PWB holding apparatus 174 is moved down to its downward-movement-end position. At this time, the negative pressure is stopped and is not supplied to the negative-pressure-supply holes 224, so that the backup pins 212 do not hold the PWB 24. When the lower surface 215 of the PWB 24 is supported on the conveyor belts 196, the backup pins 212 are separated from the PWB 24. Then, the PWB 24 is carried out by the PWB conveyor 22, and the next PWB 24 is carried in so that ECs 32 are mounted on the next PWB 24.

After the ECs 32 have been mounted on all the PWBs 24 that are pre-programmed, a resetting operation is carried out. The resetting operation includes replacing the suction nozzle 60 with another suction nozzle 60, replacing the ECs 32 supplied by the EC supplying device 18, with other ECs 32, changing the width of the PWB conveyor 22 to convey the PWB 24, etc., and particularly includes detaching the backup pins 212 of the EC holding apparatus 174, from the holding table 210, and re-attaching the backup pins 212 to the holding table 210. Since the replacing of the suction nozzle 60 and so on are not relevant to the present invention, no description thereof is provided here. Next, the resetting of the PWB holding apparatus 174 will be described.

The detaching of the backup pins 212 and the re-attaching of the same 212 are automatically carried out according to a control program pre-stored in the ROM 504 and a batch of backup-pin setting data pre-stored in the RAM 506. That is, the PWB holding apparatus 174 is automatically reset. As previously described, the backup-pin setting data include data representing the respective horizontal-direction positions, and respective rotation positions, of the backup pins 212. In the present embodiment, those positions are so determined as to satisfy both a first condition given for the PWB 24 and a second condition given for the PWB holding apparatus 174. The first condition is that the backup pins 212 can engage respective portions of the PWB 24 that are free of the ECs 32 mounted thereon and are free of unevenness and the suction cups 310 can closely contact the PWB 24 without interfering with the ECs 32 mounted thereon. A batch of design data for a PCB 24 include data representing respective positions on the back surface 215 of the PWB 24 where ECs 32 are to be mounted, and respective positions where the back surface 215 of the PWB 24 has uneven portions.

The second condition is that the seat members 320 of the backup pins 212 do not interfere with each other, and the seat members 320 closely contact the respective portions of the upper surface 244 that surround the openings of the negative-pressure-supply holes 224, so as to cover completely the holes 224. Even in the case where a seat member 320 covers only a portion of a negative-pressure-supply hole 224, an opening and closing valve 260 present in the hole 224 may be opened, so that the negative pressure may leak. Since the seat member 320 of each backup pin 212 is elongate and the pin 286 thereof is connected to the lengthwise middle portion of the seat member 320, the pin 286 can be positioned, on the holding table 210, at an arbitrary position within a circle whose radius is equal to the distance between the central axis of the pin 286 and the center of the hole 224 and whose center coincides with the center of the hole 224. The distance between the central axis of the pin 286 and the center of the hole 224 takes a maximal value when the hole 224 is aligned with one of opposite end portions of the seat member 320. Therefore, the pin 286 can be positioned at an arbitrary position within a circle whose radius is equal to the maximal value. In the present embodiment, the respective circles associated with the plurality of negative-pressure-supply holes 224 overlap each other to cover substantially entirely the upper surface 244 of the holding table 210. Thus, the pin 286 of each backup pin 212 can be positioned at an arbitrary position on the upper surface 244 of the holding table 210. However, in the case where a plurality of backup pins 212 are placed on the holding table 210, it is required that the respective seat members 320 of the backup pins 212 do not interfere with each other. This limits the respective positions of the pins 286. Thus, the horizontal-direction positions, and rotation positions, of the backup pins 212 are so determined automatically, or by an operator, as to satisfy both the condition given to the PWB 24 and the condition given to the PWB holding apparatus 174. The PWB 24 conveyed by the PWB conveyor 22 and stopped by the stopper are held by the backup pins 212 which are placed on the holding table 210, according to the thus determined positions, such that the backup pins 212 satisfy the respective conditions given to the PWB 24 and the PWB holding apparatus 174.

The resetting of the PWB holding apparatus 174 is performed in a state in which the holding apparatus 174 is positioned at its downward-movement-end position, the PWB 24 has been carried, by the PWB conveyor 22, out of the holding apparatus 174, and a vacant space is present above the holding apparatus 174. In addition, for the resetting operation, the movable guide 190 is moved away from the fixed guide 188, so that a maximal distance is present between the two guides 188, 190. In this state, the X-Y robot 48 moves the transferring unit 360 to detach the backup pins 212 presently attached to the holding table 210 and return the same 212 to the storing device 340. After all the backup pins 212 attached to the holding table 210 are returned to the storing device 340, the backup pins 212 are re-attached to the holding table 210 to hold a new sort of PWB 24 on which ECs 32 are to be mounted. The detaching of the backup pins 212 is performed according to the batch of pin setting data that had been used to attach those backup pins 212 to the holding table 210. The re-attaching of the backup pins 212 is performed according to another batch of pin resetting data for re-setting the PWB holding apparatus 174 to hold the new sort of PWB 24.

In the present embodiment, the plurality of backup pins 212 attached to the holding table 210 are detached from the holding table 210, in an order reverse to the order in which the backup pins 212 had been attached to the same 210, and are returned to the storing device 340 in an order reverse to the order in which the backup pins 212 had been taken out (of the same 340. In the present embodiment, the order of attaching of the backup pins 212 is so prescribed that the pins 212 are attached earlier to remoter positions on the holding table 210 from the storing device 340; and the order of taking of the backup pins 210 from the storing device 340 is so prescribed that the pins 212 stored at nearer positions in the storing device 340 to the holding table 210 are taken earlier out of the storing device 340 and are attached to the remoter positions of the holding table 210. Therefore, the detaching of the backup pins 212 from the holding table 210 is performed in such a manner that the pins 212 at nearer positions on the holding table 210 to the storing device 340 are detached from the holding table 210 earlier, and the pins 212 are stored earlier at remoter positions in the storing device 340 from the holding table 210.

When the backup pins 212 are detached from the holding table 210, first, the transferring unit 360 is moved, according to the backup-pin setting data, to a position above the pin 286 of one backup pin 212 to be detached. During this movement, the transferring head 362 is rotated by the rotating device 364, so that a rotation position of the pin holder 368 (i.e., a direction in which the two grasping fingers 370 are opposed to each other) is changed to a rotation position at which the pin holder 368 should hold the one pin 212, i.e., the above-indicated direction is parallel to the lengthwise direction of the seat member 320. Thus, when the two grasping fingers 370 grasp the one backup pin 212, those fingers 370 are opened and closed in a flat space including the seat member 320 and the pin 286 and perpendicular to the holding table 210, without projecting from above the seat member 320 in directions parallel to the widthwise direction of the one pin 212 or interfering with the other backup pins 212 adjacent to the one pin 212. Since the one backup pin 212 is attached, at a prescribed rotation position, to the holding table 210, the pin holder 368 is rotated according to this rotation position, so that the two grasping fingers 370 are positioned at a rotation position at which the fingers 370 should grasp the one pin 212.

After the above-described movement, the transferring head 362 is moved downward by the elevating and lowering device 366, so that the pin holder 368 grasps the one backup pin 212. When the head 362 is moved downward, the two grasping fingers 370 are kept opened; and in a state in which the pin holder 368 is positioned at its downward-movement-end position, the fingers 370 are positioned at respective positions outside the neck portion 300 of the one pin 212, as indicated at two-dot chain line in FIG. 7. Then, the two fingers 370 are closed and, as shown in FIGS. 7 and 9, the engaging portions 444 of the fingers 370 enter the circular groove 302 and the inclined surfaces 448 of the engaging portions 444 engage the side surfaces 304 defining the groove 302. Thus, the fingers 370 grasp the one pin 212.

After the two grasping fingers 370 grasp the one backup pin 212, the elevator table 378 is moved upward to move the pin holder 368 upward, and the one pin 212 is moved up off the holding table 210 against the magnetic force. Since the respective engaging portions 444 of the two grasping fingers 370 are fitted in the circular groove 302 such that the inclined surfaces 448 are engaged with the side surfaces 304, the elongate backup pin 212 is lifted up off the holding table 210, and moved upward away from the same 210, without being tilted. Then, the X-Y robot 48 moves the transferring unit 360 to the storing device 340. During this movement, the transferring head 362 is rotated to change the rotation position of the backup pin 212 to a rotation position at which the pin 212 should be stored in the storing device 340, e.g., a rotation position at which the lengthwise direction of the seat member 320 of the pin 212 is parallel to the X-axis direction. In the present embodiment, the computer 510 knows what positions in the storing device 340 are vacant, i.e., can accommodate backup pins 212, and transfers the pin holder 368 to return the backup pins 212, as previously described, in the order reverse to the order in which the pins 212 had been taken out of the storing device 340.

After the pin holder 368 is transferred, the holder 368 is moved downward to place the backup pin 212 in the storing device 340. The height position of the support surface of the storing device 340 that supports the lower surface of the pin 212 is level with that of the upper surface 244 of the holding table 210 of the PWB holding apparatus 174 being positioned at its downward-movement-end position. After the pin holder 368 is moved downward, the backup pin 212 is stored in the storing device 340 such that the lower surface of the pin 212 is supported on the support surface of the storing device 340. The detachment of the backup pins 212 from the holding table 210 is performed in the order reverse to the order in which the pins 212 had been attached to the table 210, and the pins 212 are placed earlier at remoter positions in the storing device 340 from the PWB holding apparatus 174. After the downward movement of the pin holder 368, the two grasping fingers 370 are opened to release the backup pin 212. Then, the pin holder 368 is moved upward, and subsequently is transferred to another backup pin 212 to be detached next from the holding table 210.

After all the backup pins 212 attached to the holding table 210 are returned to the storing device 340, a new set of backup pins 212 are attached to the holding table 210 to hold a new sort of PWB 24 on which ECs 32 are to be mounted. The X-Y robot 48 moves the transferring head 362 to take the backup pins 212 out of the storing device 340, transfer the pins 212, and place the same 212 on the holding table 210. To this end, the computer 510 controls the movement of the pin holder 368, such that as described previously, the backup pins 212 are taken earlier out of nearer positions in the storing device 340 to the holding table 210. During the movement of the pin holder 368 to each backup pin 212 to be taken out, the holder 368 is so rotated that the two grasping fingers 370 are positioned at a rotation position at which the fingers 370 should grasp the each pin 212, i.e., a rotation position at which the direction in which the two fingers 370 are opposed to each other and are opened and closed is parallel to the lengthwise direction of the seat member 320 of the each pin 212 stored in the storing device 340 and, in the present embodiment, parallel to the X-axis direction. After the movement of the pin holder 368, the holder 368 is moved downward and subsequently the two fingers 370 are closed to grasp the each pin 212. Then, the holder 368 is moved upward to take the each pin 212 out of the storing device 340.

Each of the backup pins 212 is transferred, according to the horizontal-position data, to a prescribed horizontal position on the holding table 210. During this transferring, the pin holder 368 is rotated according to the rotation-position data so that the each pin 212 is rotated to a prescribed rotation position at which the each pin 212 should be attached to the holding table 210. After the transferring, the pin holder 368 is moved downward and the pin 212 is placed on the table 210. More specifically described, the seat surface 329 of the seat member 329 is closely contacted with a portion of the upper surface 244 of the table 210 that surrounds a group of communication holes 240, i.e., the opening of a negative-pressure-supply hole 224 or a valve hole 226. After the pin 212 is placed on the table 210, the two fingers 370 are opened to release the pin 212.

Each backup pin 212 placed on the holding table 210 is fixed to table 210 by the magnetic attraction exerted thereto, as described previously. In addition, the ball 268 is moved away from the valve seat 262 by the magnetic force applied thereto, so that the opening and closing valve 260 is opened. Since the permanent magnets 328 are elongate, the magnets 328 can be aligned with the ball 268, even if the backup pin 212 may be attached to the holding table 210 such that the pin 268 is not aligned with the negative-pressure-supply hole 224. Thus, the ball 268 is magnetically attracted toward the backup pin 212, and is separated from the valve seat 262. After the backup pin 212 is released, the pin holder 368 is transferred to the storing device 340 to take out another backup pin 212 to be attached next to the table 210.

When a prescribed number of backup pins 212 are attached to respective pre-selected ones of all the negative-pressure-supply holes 224 of the holding table 210, the opening and closing valves 260 associated with those selected holes 224 are opened. On the other hand, regarding the remaining negative-pressure-supply holes 224 to which no backup pins 212 are attached, the opening and closing valves 260 associated therewith remain closed. Thus, no caps or the like are needed to close the remaining holes 224 to prevent the leakage of the negative pressure, and the PWB holding apparatus 174 which can hold desired portions of the PWB 24 at a desired distance from the holding table 210 can be easily reset in a short time. That is, only a short time is needed to perform a resetting operation, which contributes to improving the operation efficiency of the EC mounting system 12. In particular, in the present embodiment, the attachment and detachment of the backup pins 212 to and from the holding table 210 are automatically performed, without needing help of an operator. Thus, the PWB holding apparatus 174 can be reset in a short time on one hand, and the apparatus 174 does not disable the EC mounting system 12 as a whole from being automatically reset, on the other hand. Since an automatic resetting device which automatically resets the PWB holding apparatus 174 shares the X-Y robot 48 with the EC mounting device 16, the resetting device can be produced at low cost, and the construction of the EC mounting system 12 can be simplified. The X-Y robot 48 cooperates with the elevating and lowering device 366 to provide a transferring device which transfers the transferring head 362 relative to the holding table 210 and the storing device 340; and the transferring device, the EC mounting device 16, the EC supplying device 18, the storing device 340, the transferring head 362, the PWB supporting and conveying device 20 including the PWB holding apparatus 174, the base 10, the control device 500, etc. cooperate with one another to provide the EC mounting system 12 which can automatically reset the PWB holding apparatus 174.

In the illustrated embodiment, the ball 268 as the valve member of each open-and-close valve 260 is formed of a ferromagnetic material, and the seat member 320 of each backup pin 212 includes the permanent magnets 328. However, the valve member may be formed of a permanent magnet and the seat member may be formed of a ferromagnetic material, as will be described below in another embodiment shown in FIGS. 15 to 17. The same reference numerals as used in the first embodiment shown in FIGS. 1 to 13 and the second embodiment shown in FIG. 14 will be used to designate the corresponding elements of the third embodiment shown in FIGS. 15 to 17, and the description of those elements is omitted. This applies to the other embodiments shown in FIG. 18 and the following figures, that is, the same reference numerals as used in the preceding embodiments are used to designate the corresponding elements of the following embodiments and the description of those elements is omitted.

In a PWB holding apparatus 596 as the third embodiment, a valve member 602 of each of a plurality of opening and closing valves 600 provided in a holding table 598 has a generally cylindrical shape having a diameter smaller than that of a valve hole 226, and is formed of a permanent magnet. Axially opposite end portions of the valve member 602 provide different magnetic poles, respectively. One 604 of axially opposite end portions of the valve member 602 has a semi-spherical shape, and the valve member 602 is provided in the valve hole 226 such that the semi-spherical portion 604 thereof is opposed to a valve seat 606 and closes a negative-pressure-supply hole 224 when being seated on the valve seat 606. There is a space between an outer circumferential surface 608 of the valve member 602 provided in the valve hole 226 and an inner circumferential surface 610 defining the valve hole 226. Since this space has only a small dimension in a radial direction of the valve hole 226, the two surfaces 608, 610 can engage each other, thereby preventing the valve member 602 from being inclined relative to the valve hole 226. Thus, the valve member 602 can be seated on the valve seat 606 such that an axis line of the valve member 602 is kept vertical and the valve member 602 is prevented from being rotated, that is, the orientation of the magnetic poles of the same 602 is maintained. In the present embodiment, the two surfaces 608, 610 cooperate with each other to provide an inclination preventing device or an orientation maintaining device.

Figure 15:
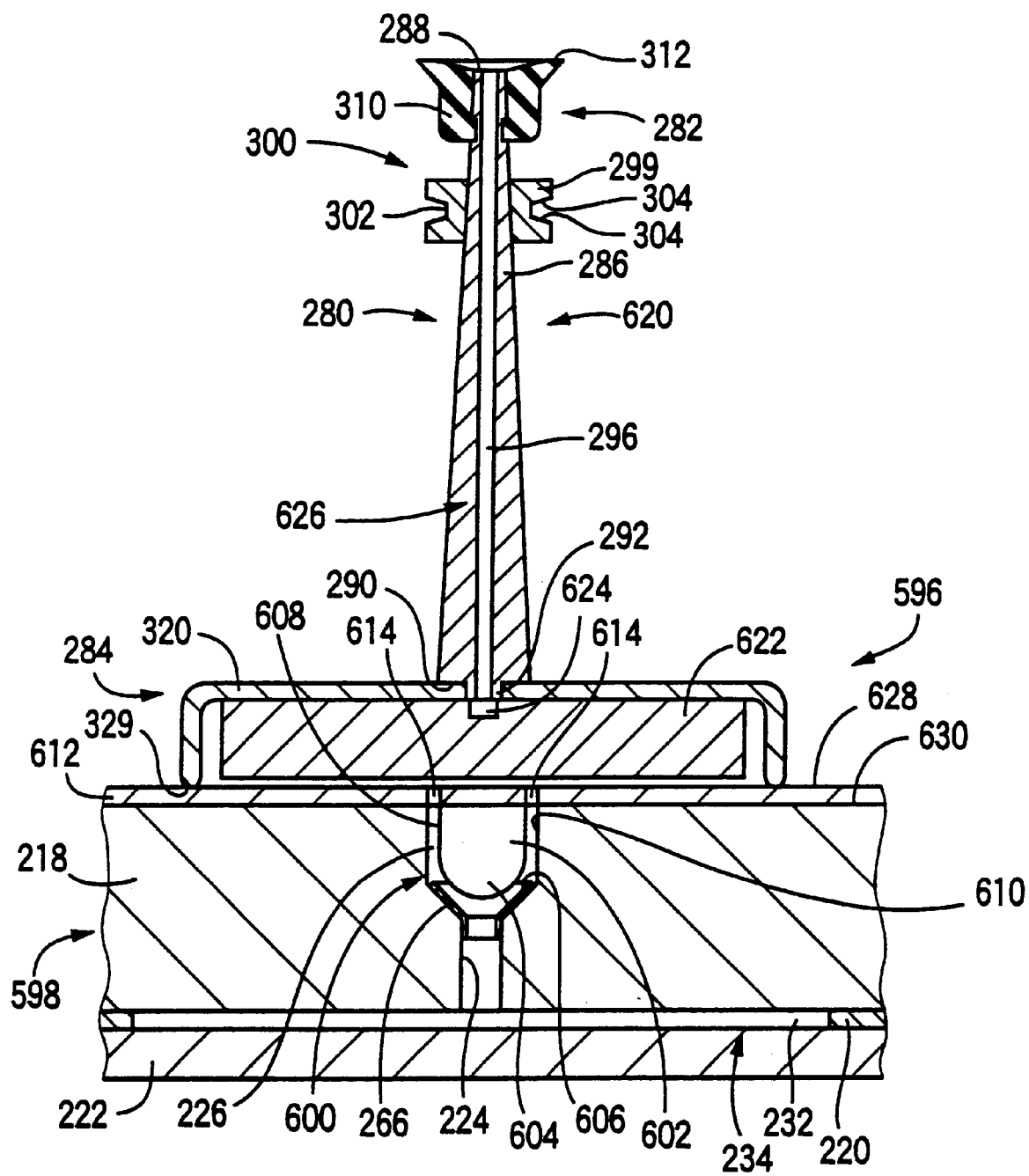
FIG. 15 is a cross-sectioned, front elevation view of a relevant portion of another PWB holding apparatus including a holding table and a backup pin attachable to the holding table.
Figure 16:
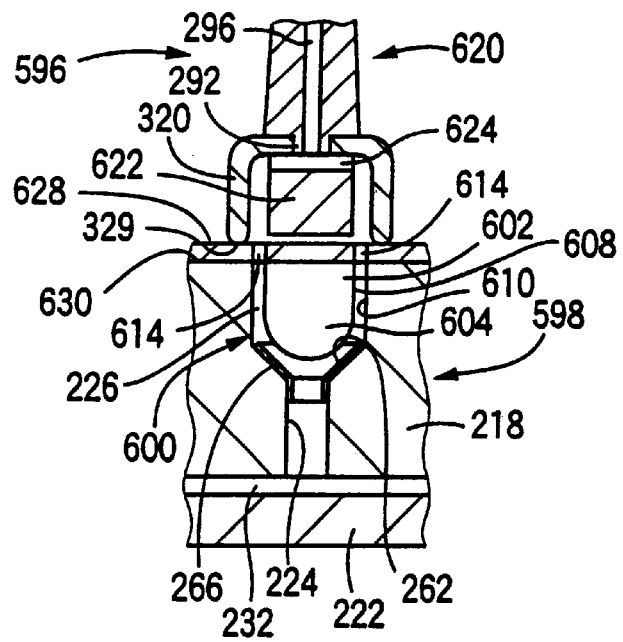
FIG. 16 is a cross-sectioned, side elevation view of the PWB holding apparatus of FIG. 16.

A coming-off preventing plate 612 is, like a base 128, formed of a non-magnetic material such as aluminum, and is integrally fixed to the base 128 and others. A portion of the coming-off preventing plate 612 that corresponds to each valve hole 226 has a plurality of communication holes 614 similar to the communication holes 240, and a lower surface of an inner portion of the plate 612 that is located inside the above-indicated portion is flat. Meanwhile, a block 622 formed of a steel as a ferromagnetic material is fixed to an inner space of a seat member 320 of each backup pin 620. The block 622 has a rectangular parallelepiped shape and has, as shown in FIGS. 15 and 16, a thickness and a width somewhat smaller than a depth and a width of the inner space of the seat member 320. The block 622 has a communication passage 624 which communicates with a passage 296 of a pin 286 of the backup pin 212. The communication passage 624 extends parallel to a widthwise direction of the block 622, and opens in respective side spaces provided between the block 622 and widthwise opposite side walls of the seat member 320, so that the communication passage 624 may communicate with the communication holes 614. The passage 296, the communication passage 624, and the side spaces provided between the block 622 and the side walls of the seat member 320 cooperate with one another to provide a negative-pressure passage 626 of the backup pin 620.

Figure 17:
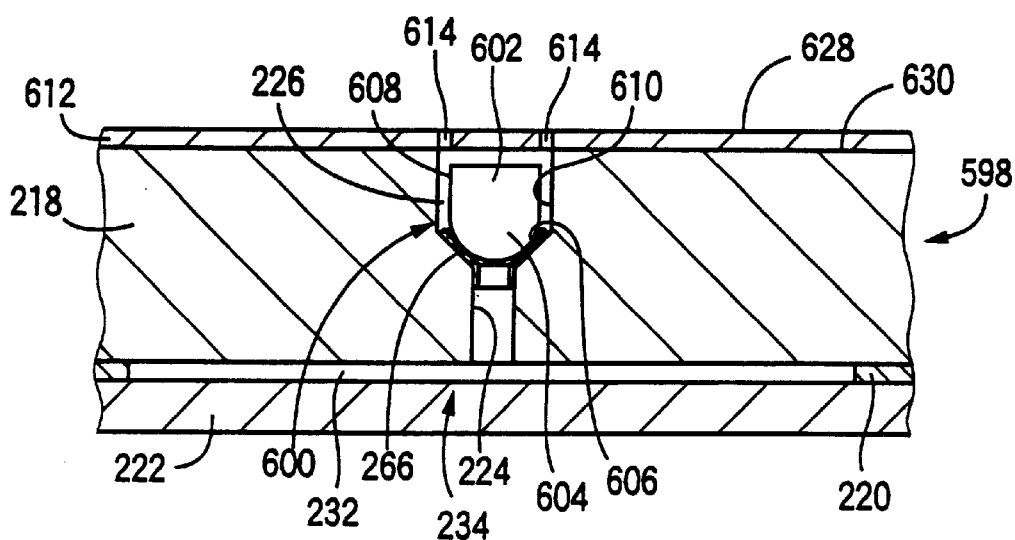
FIG. 17 is a cross-sectioned, front elevation view showing a state in which no backup pin is attached to the holding table of the PWB holding apparatus of FIG. 15.

In a state, shown in FIG. 17, in which the backup pins 620 are not attached to the holding table 598, the valve members 602 are seated, owing to their own weights, on the valve seats 606 to close the opening and closing valves 600. In a state, shown in FIG. 15, the backup pins 620 are attached to the holding table 598, the block 622 of each backup pin 620 is magnetized, and the valve member 602 is attracted toward the block 622 by the magnetic force, so that the valve member 602 is moved away from the valve seat 606 to open the open-and-close valve 600. In addition, owing to this magnetic force, the backup pin 620 is attracted and fixed to the holding table 598. Since the coming-off preventing plate 612 formed of aluminum as non-magnetic material is present between the block 622 and the valve member 602, the magnetic force exerted to the backup pin 620 is weakened. However, the weakened magnetic force is great enough to fix the backup pin 620 to the holding table 598. In the present embodiment, it can be said that an upper surface 628 of the coming-off preventing plate 612 provides an upper surface of the holding table 598 and the backup pins 620 are attached to the upper surface 628 of the preventing plate 612, or alternatively it can be said that an upper surface 630 of the base 218 provides an upper surface of the holding table 598 and the backup pins 620 are attached to the holding table 598 via the coming-off preventing plate 612 formed of aluminum as non-magnetic material. In the latter case, it can be said that a portion of the preventing plate 612 that covers each valve hole 226 cooperates with the base 218 and others to provide the holding table 598.

Figure 18:
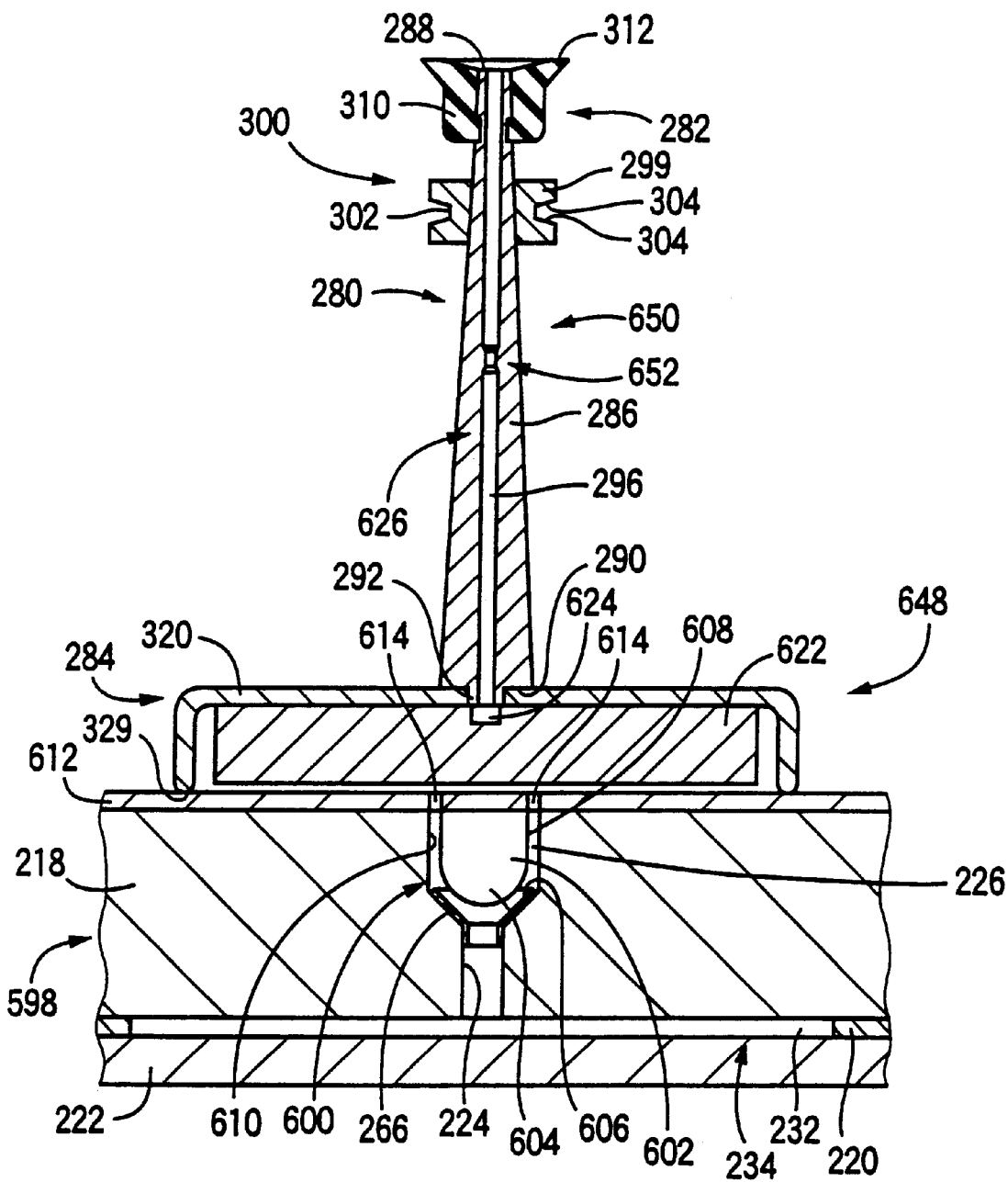
FIG. 18 is a cross-sectioned, front elevation view of another PWB holding apparatus including a holding table and a backup pin attachable to the holding table.

In the above-described case in which each valve member is formed of a permanent magnet and the lower end portion of each backup pin is formed of a ferromagnetic material, it is preferred to employ an orifice 652 as a sort of flow restrictor in a passage 296 as part of a negative-pressure passage 626 of each backup pin 650, as will be described below in a PWB holding apparatus 648 as the fourth embodiment shown in FIG. 18. When the PWB holding apparatus 648 is moved upward, negative-pressure-supply holes 224 are communicated with a negative-pressure source 70 to supply a negative pressure to the backup pins 650. Therefore, before the backup pins 650 hold a PWB 24, the orifice 652 of each backup pin 650 restricts flow of air, so that a negative pressure on one of opposite sides of the orifice 652 that is nearer to the negative-pressure source 70 or the seat member 320 is greater than a negative pressure on the other side of the same 652. Therefore, the backup pins 650 are fixed to the holding table 598 owing to both the magnetic force and the negative pressure.

The attracting force with which the holding table 598 attracts the seat member 320 of each backup pin 650 by applying the negative pressure thereto is increased in a state in which the backup pins 650 hold the PWB 24, because, in that state, the passage 296 is closed by the PWB 24 and accordingly the negative pressure present between the seat member 320 and the holding table 598 is increased. Therefore, even if, when ECs 32 are mounted on the PWB 24, such a force which can move the backup pins 650 relative to the holding table 598 may be actually exerted to the backup pins 650, the backup pins 650 are effectively prevented from being moved relative to the holding table 598.

On the other hand, in a state in which the PWB holding apparatus 648 is positioned at its downward-movement-end position, the negative pressure is not supplied to the backup pins 650, so that the backup pins 650 are fixed to the holding table 598 owing to the magnetic force only. Thus, the backup pins 650 can be easily detached from the holding table 598.

The orifice 652 employed in the present embodiment may be employed in each of the first and second embodiments in which each valve member is formed of a ferromagnetic material and the lower end portion of each backup pin is formed of a permanent magnet.

Figure 19:
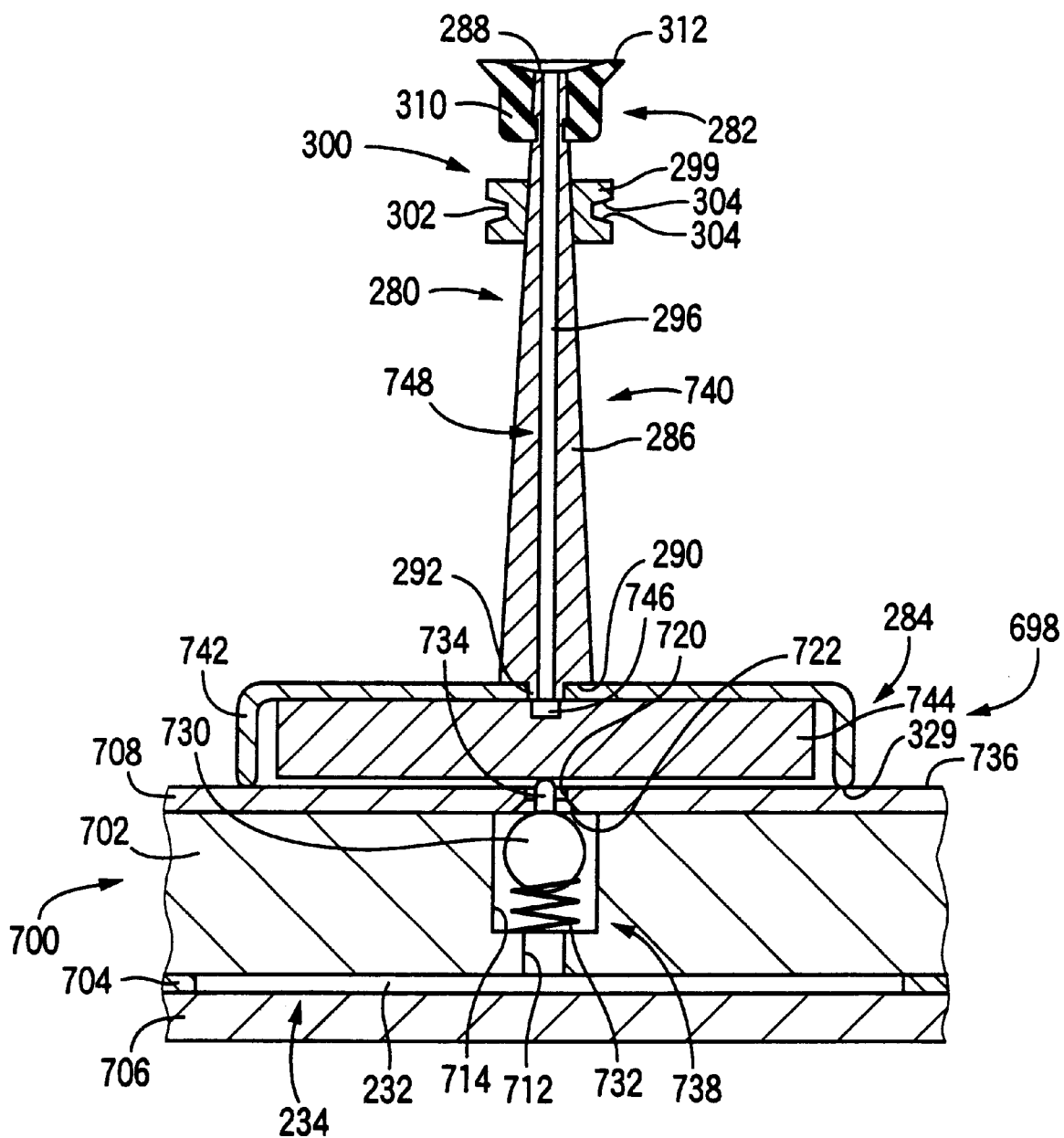
FIG. 19 is a cross-sectioned, front elevation view of another PWB holding apparatus including a holding table and a backup pin attachable to the holding table.

In each of the preceding embodiments, each open-and-close valve 260, 600 is designed such that the valve member 268, 602 is moved away from the valve seat 262, 606, owing to a magnetic force, so as to open the valve 260, 600. However, each open-and-close valve may be mechanically opened and closed, as will be described below in the fifth embodiment shown in FIGS. 19 and 20.

In a PWB holding apparatus 698 as the fifth embodiment, a holding table 700 includes a base 702, a spacer 704, a cover 706, and a valve-seat plate 708 as a valve-seat member. The valve-seat plate 708 is provided by a flat member having substantially the same size as that of the base 702. The base 702, the spacer 704, the cover 706, and the valve-seat plate 708 are superposed on one another, and respective outer peripheral portions of the elements 702, 704, 706, 708 that are located outside communication passages 234 are fixed to one another by a fixing device, not shown. The base 702 has a plurality of negative-pressure-supply holes 712, and a valve hole 714 having a larger diameter than that of each negative-pressure-supply hole 712 is formed in an end portion of the each hole 712 located on the side of the valve-seat plate 708.

The valve-seat plate 708 is formed of a ferromagnetic material such as steel, and covers the plurality of valve holes 714. The valve-seat plate 708 has, in a portion thereof corresponding to each valve hole 714, a through-hole 720 which has a smaller diameter than that of the valve hole 714 and is concentric with the same 714. The through-hole 720 includes, on the side of the valve hole 714, a tapered end portion whose diameter increases in a direction toward the same 714 and which provides a valve seat 722. Thus, the valve-seat plate 708 can be thought as a plurality of valve-seat members which are assembled into an integral member. The maximal diameter of each valve seat 722 is smaller than that of the valve hole 714. The valve-seat plate 708 provides the valve seats 722 and covers the valve holes 714.

Figure 20:
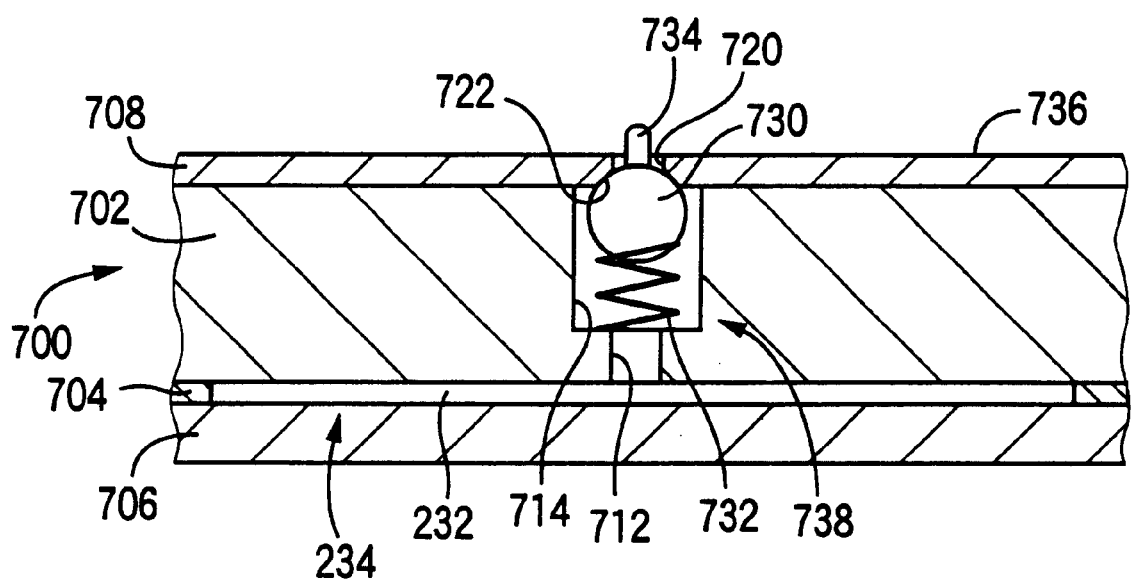
FIG. 20 is a cross-sectioned, front elevation view showing a state in which no backup pin is attached to the holding table of the PWB holding apparatus of FIG. 19.

A ball 730 as a valve member is received in each valve hole 714, such that the ball 730 is movable in the valve hole 714. A compression coil spring (hereinafter, referred to as the spring) 732 biases the ball 730 toward the valve seat 722. A valve-opening projection 734 having a circular cross section projects from a portion of the ball 730 that is located on the side of the valve seat 722. A diameter of the projection 734 is smaller than that of the through-hole 720, so that the ball 730 is allowed to seat on the valve seat 722. As shown in FIG. 20, the valve-opening projection 734 has such a length which assures that in a state in which the ball 730 is positioned at a closing position where the ball 730 is seated on the valve seat 722, the projection 734 extends through the through-hole 720 and projects into an outside space over an upper surface 736 of the valve-seat plate 708. A free end portion of the valve-opening projection 734 has a semi-spherical shape. In the present embodiment, the valve hole 714, the valve seat 722, the ball 730, the spring 732, and the valve-opening projection 734 cooperate with one another to provide an open-and-close valve 738.

A permanent magnet 744 is fixed to an inner space of a seat member 742 of each backup pin 740. The permanent magnet has a rectangular-parallelepiped shape, and has a thickness and a width somewhat smaller than a depth and a width of the inner space of the seat member 742, respectively. The permanent magnet 744 has a communication passage 746 which communicates with a passage 296 of the backup pin 740 and extends parallel to a widthwise direction of the magnet 744. The passage 296, the communication passage 746, and small clearances provided between the permanent magnet 744 and two side walls of the seat member 742 cooperate with one another to provide a negative-pressure passage 748.

In the state, shown in FIG. 20, in which the backup pins 740 are not attached to the holding table 700, each ball 730 is positioned at its closing position where the each ball 730 is seated, owing to the biasing action of the spring 732, on the corresponding valve seat 722, to close the corresponding open-and-close valve 738, and the valve-opening projection & 734 projects upward above the upper surface 736 of the holding table 700, allowing the each ball 730 to seat on the valve seat 722. Therefore, when each backup pin 740 is attached to the holding table 700, the permanent magnet 744 engages the projection 734 and moves the same 734 against the biasing force of the spring 732 so that the ball 730 is moved away from the valve seat 722. In a state in which the seat member 742 of the each pin 740 is contacted with a portion of the upper surface 736 of the holding table 700 that surrounds the opening of the valve hole 714 of the negative-pressure-supply hole 712, the valve-opening projection 734 is engaged with the permanent magnet 744 of the each pin 740, and the ball 730 is positioned at an opening position away from the valve seat 722. Thus, the open-and-close valve 738 is opened, and the negative-pressure passage 748 is communicated with the negative-pressure-supply hole 712 and is supplied with the negative pressure. In addition, the permanent magnet 744 magnetizes the valve-seat plate 708 formed of steel as ferromagnetic material, and the thus produced magnetic force causes the each pin 740 to be attracted and fixed to the holding table 700. In the present embodiment, the valve-seat plate 708 formed of ferromagnetic material and the permanent magnet 744 of the backup pin 740 cooperate with each other to provide a fixing device which fixes the backup pin 740 to the holding table 700.

A valve-opening projection may be supported by each backup pin, as will be described below in the sixth embodiment shown in FIGS. 21 and 22.

In a PWB holding apparatus 798 as the sixth embodiment, an open-and-close valve 800 includes a ball 802 as a valve member that has no valve-opening projection. A seat member 814 as a seat portion of each backup pin 810 has a container-like shape that is larger than a lower end portion of a pin 286, or a through-hole 720, and a permanent magnet 816 is fixed to an inner space of the seat member 814. The seat member 814 has, e.g., a circular cross section. The permanent magnet 816 has dimensions somewhat smaller than those of the inner space of the seat member 814, and has a communication passage 818 which communicates with a passage 296 and extends perpendicularly to the passage 296. The passage 296, the communication passage 818, and a small clearance provided between the permanent magnet 816 and a circular wall of the seat member 814 cooperate with one another to provide a negative-pressure passage 819. A valve-opening projection 820 projects downward from a lower surface of the permanent magnet 816, such that a lower or free end portion of the projection 820 is located below a seat surface 822 as a lower surface of the seat member 814. The valve-opening projection 820 has a diameter smaller than that of the through-hole 720, and has such a length which assures that when the backup pin 810 is attached to the holding table 700, the projection 820 moves the ball 802 away from the valve seat 722.

Figure 22:
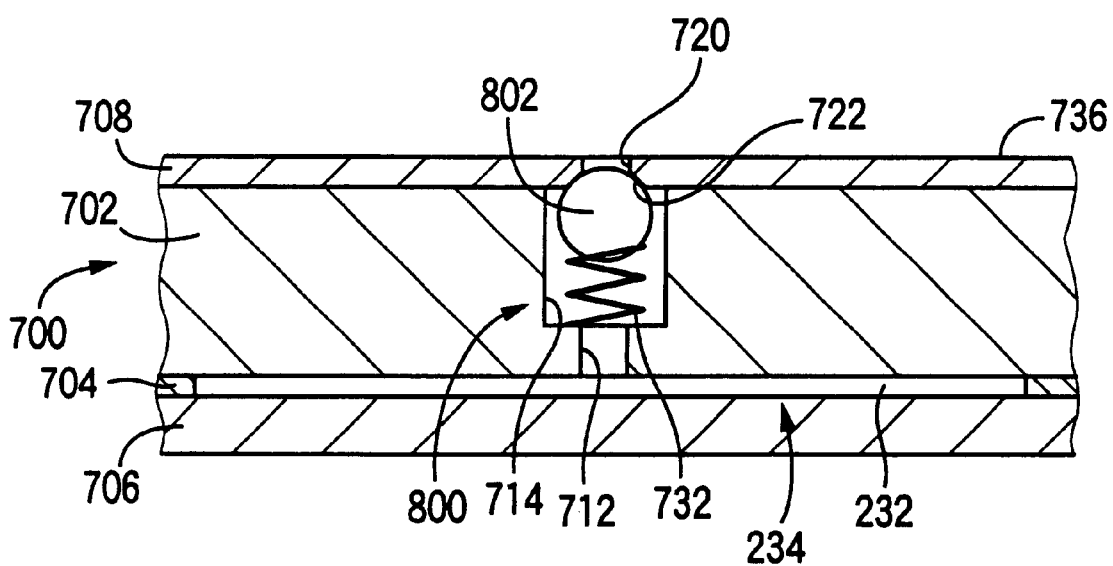
FIG. 22 is a cross-sectioned, front elevation view showing a state in which no backup pin is attached to the holding table of the PWB holding apparatus of FIG. 21.

In a state, shown in FIG. 22, in which the backup pins 810 are detached from the holding table 700, each ball 802 is positioned at a closing position where the each ball 802 is seated, owing to a biasing action of a spring 732, on the corresponding valve seat 722, to close the corresponding open-and-close valve 800. When each backup pin 810 is attached to the holding table 700, the valve-opening projection 820 is inserted into the through-hole 720 to enter a valve hole 714 and engage the ball 802. Further, the projection 820 moves the ball 802 against a biasing force of the spring 732 so that the ball 802 is moved away from the valve seat 722 to its opening position. Thus, the open-and-close valve 800 is opened, and the negative-pressure-supply hole 712 is opened and is communicated with the negative-pressure passage 819. The seat surface 822 of the seat member 814 is closely contacted with a portion of an upper surface 736 of the holding table 700 that surrounds the opening of the through-hole 720, so that the negative pressure is prevented from leaking. In addition, the backup pin 820 is fixed to the holding table 700 by the magnetic force. The backup pin 810 can be moved relative to the holding table 700, within a range in which the projection 820 can be moved in the through-hole 720. This range is small and, though the backup pin 810 is fixed to the holding table 700 by the magnetic force, the permanent magnet 816 is small.

Figure 23:
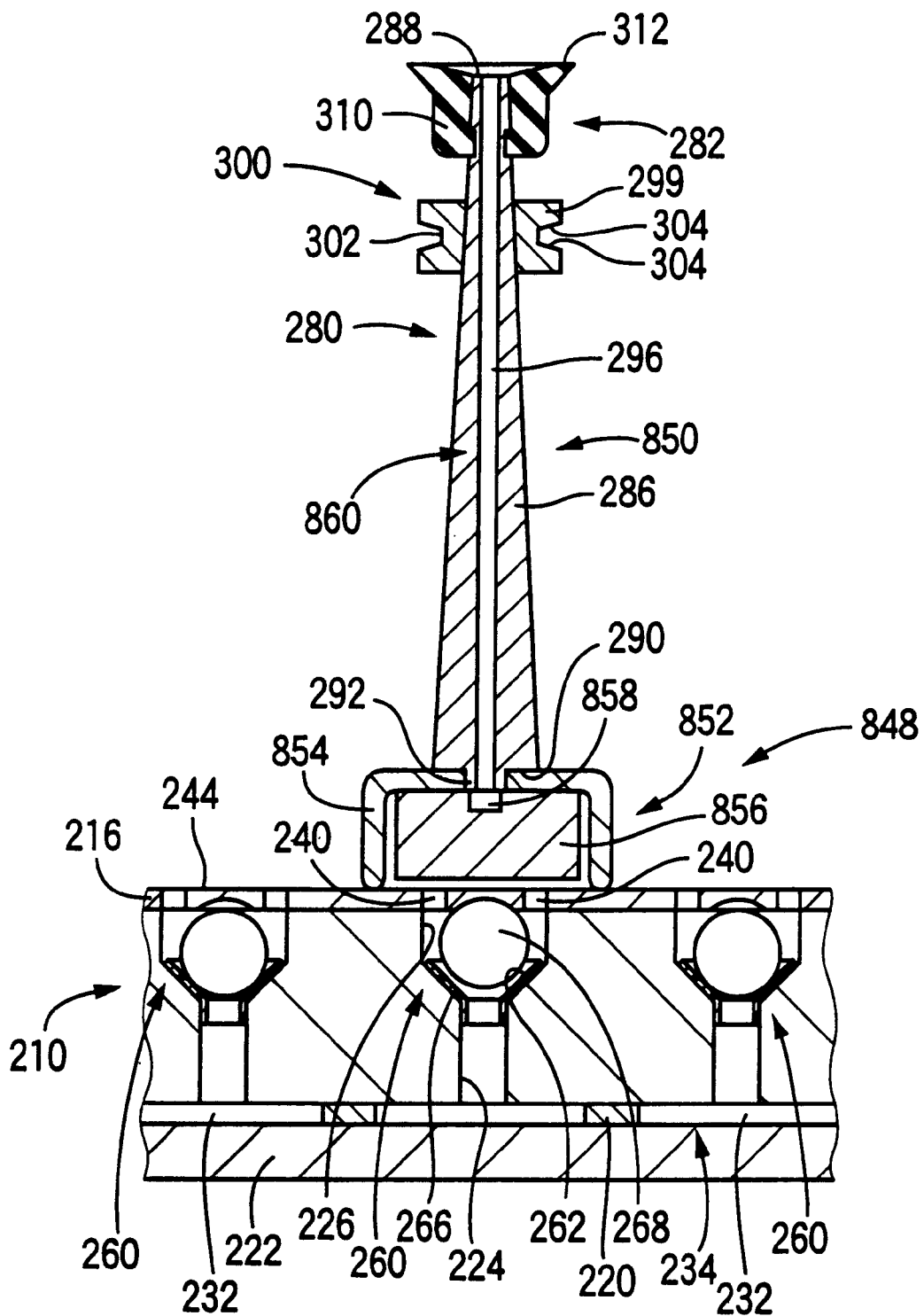
FIG. 23 is a cross-sectioned, front elevation view of another PWB holding apparatus including a holding table and a backup pin attachable to the holding table.

In each of the embodiments shown in FIGS. 1 to 18, a magnetic force is used to move each valve member 268, 602 away from the corresponding valve seat 262, 606 to open the corresponding open-and-close valve 260, 600, and each backup pin 212, 620, 650 includes the elongate seat member 320 so that the backup pin 212, 620, 650 can hold a portion of the PWB 24 that falls in a wide range. However, it is possible to attach each backup pin to a holding table, in such a manner that an axis line of the backup pin is aligned with a center of a negative-pressure-supply hole, so that the backup pin supports a PWB, as will be described in the seventh embodiment shown in FIG. 23.

In a PWB holding apparatus 848, each backup pin 850 includes a seat portion 852 which is provided by a seat member 854. The seat member 854 has a container-like shape having a circular cross section. An inner diameter of the seat member 854 is somewhat greater than a diameter of a valve hole 226, and a permanent magnet 856 is fixed to an inner space of the seat member 854. The permanent magnet 856 has a cylindrical shape having a diameter somewhat smaller than the inner diameter of the seat member 854, and has a communication passage 858 which communicates with a passage 296 of a pin 286. The communication passage 858 is formed through the permanent magnet 856 in a diametrical direction thereof. The passage 296, the communication passage 858, and a circular clearance provided between the magnet 856 and a circular wall of the seat member 854 cooperate with one another to provide a negative-pressure passage 860. The backup pin 850 is fixed to a holding table 210 by a magnetic force, and a ball 268 is attracted by the permanent magnet 856 and a coming-off preventing plate 216, so that the ball 268 is moved away from a valve seat 262 and a negative pressure is supplied from a negative pressure-supply hole 224 to the negative-pressure passage 860 via communication holes 240.

The backup pin 850 is attached to the holding device 210, at a position where a suction cup 310 sucks and holds a portion of the PWB 24 and an axis line of the pin 286 is aligned with a center of the negative-pressure-supply hole 224. Since the inner diameter of the seat member 854 is somewhat greater than the diameter of the valve hole 226, the position of the backup pin 850 can be changed, as such, relative to the negative-pressure-supply hole 224. However, an amount by which the position of the circular-seat backup pin 850 is allowed to change is smaller than an amount by which the position of the elongate-seat backup pin 212, 620, 650 is allowed to change. Therefore, in the present embodiment, a greater number of negative-pressure-supply holes 224 are formed in the holding table 210, than a number of the negative-pressure-supply holes 224 formed in the holding table 210, 598 used with the elongate-seat backup pins 212, 620, 650, so that a portion of the PWB 24 that can be held by each backup pin 850 may be aligned, at a higher probability, with a portion of the holding table 210 to which the each backup pin 850 can be attached. However, some of the respective open-and-close valves 260 associated with the negative-pressure-supply holes 224 are opened by the backup pins 850 attached to the holding table 210, and the other valves 260 remain closed. Therefore, it is not needed to close, with caps or the like, the negative-pressure-supply holes 224 to which the backup pins 850 are not attached. Thus, the greater number of negative-pressure-supply holes 224 formed in the holding table 210 does not result in increasing a time needed to attach the backup pins 850 to the holding table 210.

In addition, a plurality of circular-seat backup pins 850 which are positioned adjacent to each other do not interfere with each other, in contrast to a plurality of elongate-seat backup pins 212, 620, 650 which are positioned adjacent to each other. Therefore, a batch of pin-setting data needed for setting the circular-seat backup pins 850 can be more easily produced. Moreover, since the seat member 854 of each backup pin 850 is circular, it is not needed to determine a rotation position at which the backup pin 850 should be attached to the holding table 210, and it is not needed to employ the rotating device 364 which rotates the pin holder 368 holding the backup pin 850. However, the seat member 854 of each backup pin 850 may have a square shape in place of the circular shape.

In each of the embodiments shown in FIGS. 1 to 18 and 23, the coming-off preventing plate 216, 612 has, in a portion thereof corresponding to each valve hole 226, the communication holes 240, 614 which communicate the negative-pressure-supply hole 224 with the negative-pressure passage 326, 626, 860. However, the coming-off preventing plate may be replaced with (a) a holding plate which is formed of a ferromagnetic material and provides an upper surface of a holding table and which has a plurality of through-holes formed through respective portions thereof corresponding to a plurality of valve holes; and (b) a plurality of lid members or a plurality of coming-off preventing plates which close the plurality of through-holes, respectively, and thereby prevent a plurality of valve members from coming off the plurality of valve holes, respectively, and which can communicate a plurality of negative-pressure-supply holes 224 with a plurality of negative-pressure passages, respectively, as will be described in the eighth embodiment shown in FIG. 24. The same reference numerals as used in the embodiments shown in FIGS. 1 to 14 are used to designate the corresponding elements of the eighth embodiment, and the description thereof is omitted.

In a PWB holding apparatus 898 as the eighth embodiment, a holding table 900 includes a base 218 and a holding plate 904 which is formed of steel as a ferromagnetic material and which is fixed to an upper surface of the base 218. The holding plate 904 has a plurality of stepped through-holes 906 formed through respective portions thereof corresponding to a plurality of valve holes 226. Each of the stepped through-holes 906 includes a large-diameter portion 910 opposite to a small-diameter portion thereof on the side of an upper surface 908 of the holding table 900 that is provided by an upper surface of the holding plate 904. A coming-off preventing plate 914 is fitted in, and is fixed to, the large-diameter portion 910 of each through-hole 906. In the present embodiment, each of the coming-off preventing plates 914 is provided by a wire mesh. It is preferred that each coming-off preventing plate 914 be formed of a magnetic material and, in the present embodiment, each wire mesh 914 is formed of a magnetic material. Therefore, when a backup pin similar to the previously-described backup pin 212 is attached to a portion of the holding plate 904 that surrounds the opening of a valve hole 226, and a ball 268 is attracted by a magnetic force and is moved away from a valve seat 262, as indicated at two-dot-chain line, an open-and-close valve 260 is opened. The coming-off preventing plate 914 prevents the ball 268 from coming off the valve hole 226, and the wire mesh of the plate 914 communicates the negative-pressure-supply hole 224 with the negative-pressure passage 326, so that a negative pressure is supplied to the passage 326.

Figure 24:
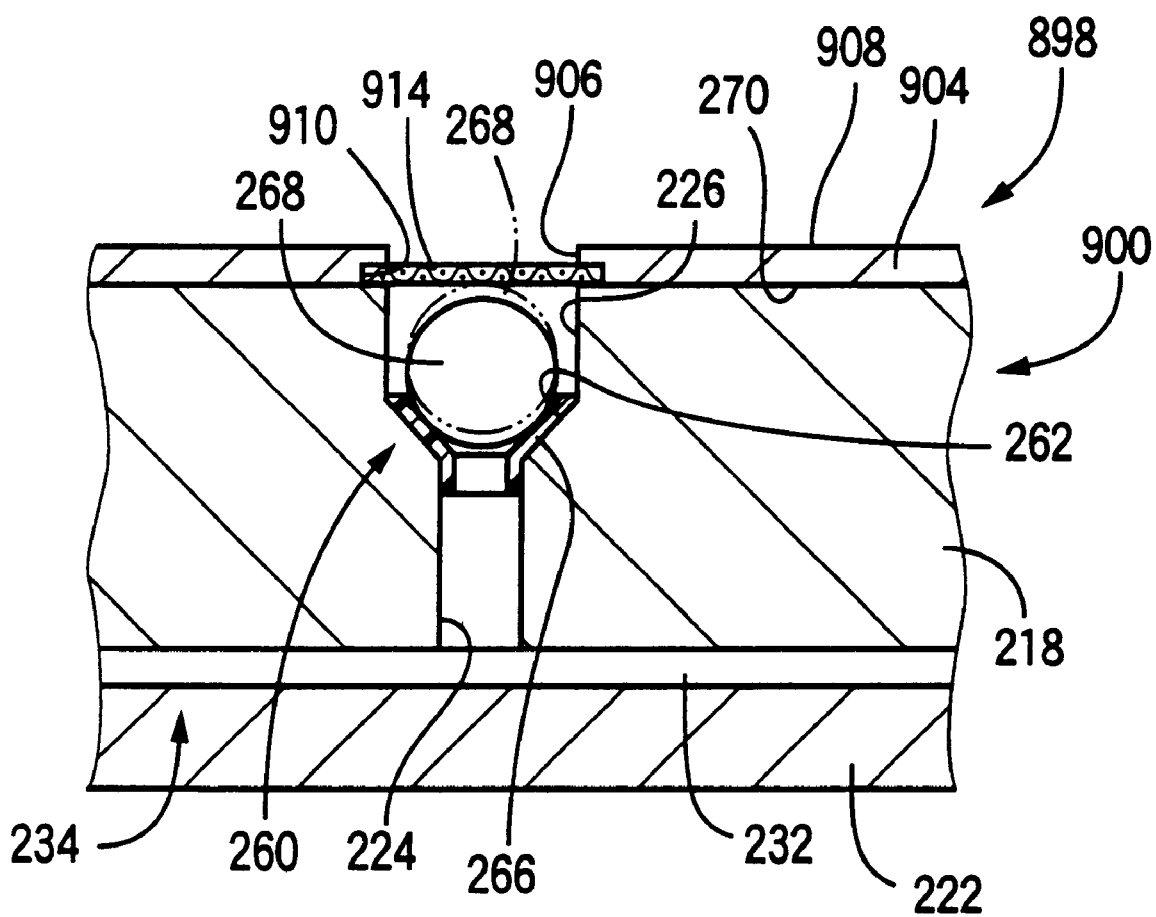
FIG. 24 is a cross-sectioned, front elevation view another PWB holding apparatus including an open-and-close valve.

In the eighth embodiment shown in FIG. 24, each coming-off preventing plate 914 provided by a wire mesh may be replaced with an iron plate having a number of through-holes formed through a thickness thereof.

Figure 26:
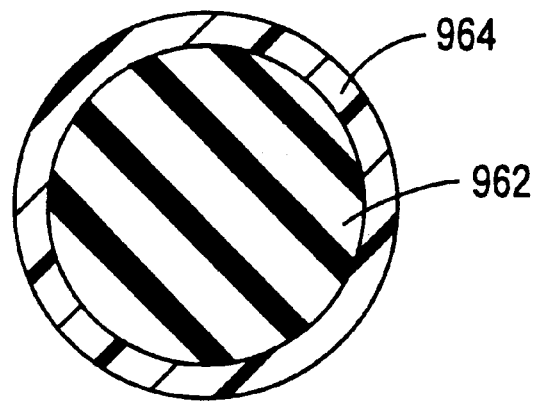
FIG. 26 is a cross-sectioned, front elevation view of an O-ring of the opening and closing valve of the PWB holding apparatus of FIG. 25.
Figure 27:
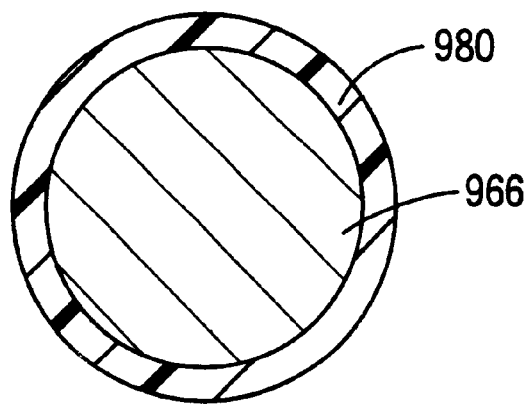
FIG. 27 is a cross-sectioned, front elevation view of a ball which is used with an O-ring of an opening and closing valve of another PWB holding apparatus and which includes a sticking-preventing layer.

In the illustrated embodiments, the valve seat 262, 602 of each open-and-close valve 260, 600 is covered with the pad 266 via which the ball 268 or the valve member 602 is seated on the valve seat 262, 602 to prevent assuredly the leakage of negative pressure. However, the pad 266 may be replaced with an O-ring, as will be described in the ninth embodiment shown in FIGS. 25 to 27. It is noted that the ninth embodiment shown in FIGS. 25 to 27 is substantially similar to the first embodiment shown in FIGS. 1 to 14 except that an O-ring is employed in place of the pad 266.

In a PWB holding apparatus 950 as the ninth embodiment, a holding table 952 has a plurality of negative-pressuresupply holes 954 each of which is associated with an open-and-close valve 956. The open-and-close valve 956 includes a valve hole 958 provided in an end portion of the negative-pressure-supply hole 954 that is located on the side of an opening of the hole 954 in an upper surface 244 of the holding table 952. An O-ring 962 formed of rubber is fixed to a bottom surface defining the valve hole 958. As shown in FIG. 26, an outer surface of the O-ring 962 is coated with a sticking-preventing layer 964 formed of polytetrafluoroethylene (PTFE) as a sort of sticking-preventing material. FIG. 26 shows the sticking-preventing layer 964 having an exaggerated thickness for easier understanding purposes only.

Figure 25:
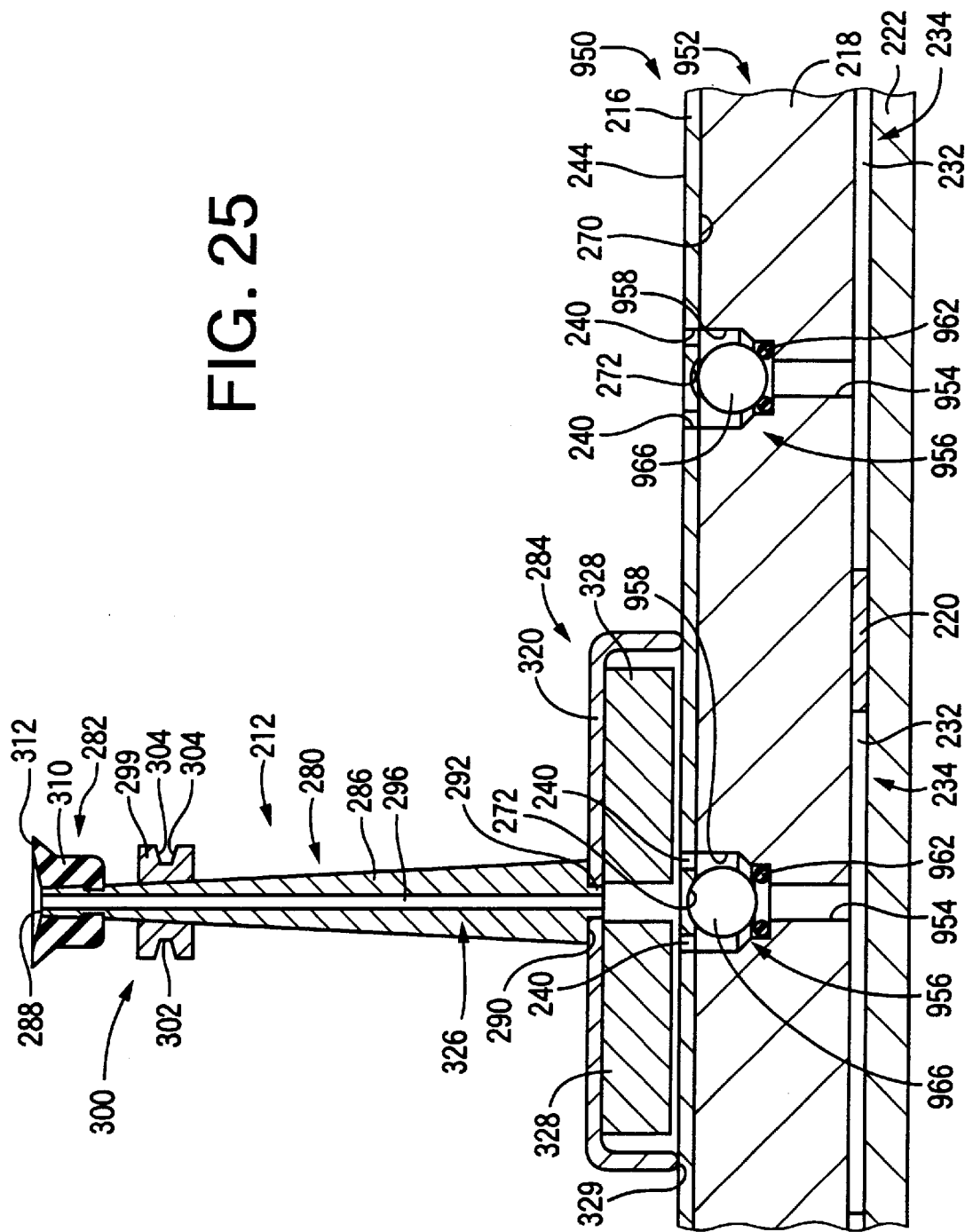
FIG. 25 is a cross-sectioned, front elevation view of another PWB holding apparatus including an opening and closing valve.

In a negative-pressure-supply hole 954, shown in a right-hand portion of FIG. 25, to which no backup pin 212 is attached, a ball 966 as a valve member that is movably received in the valve hole 958 is seated owing to its weight on the O-ring 962. Thus, the O-ring 962 is contacted with both the ball 966 and an inner wall surface defining the valve hole 958. However, the ball 966 is not contacted with the inner wall surface defining the vale hole 958 and, when the ball 966 is contacted with the O-ring 962, the open-and-close valve 956 is closed. Thus, the O-ring 962 functions as a valve seat of the valve 956. In a state in which a negative pressure is supplied to the negative-pressure-supply hole 954 so as to hold a PWB 24, the negative pressure acts on the ball 966 so that the ball 966 is pressed against the O-ring 962 and the O-ring 962 is elastically deformed. Thus, the negative pressure is effectively prevented from leaking.

In a negative-pressure-supply hole 954, shown in a left-hand portion of FIG. 25, to which a backup pin 212 is attached, the ball 966 that is formed of a ferromagnetic material is attracted by a magnetic force to the coming-off preventing plate 216, and is moved away from the O-ring 962 to open the open-and-close valve 956. Thus, the negative pressure is supplied to the negative-pressure passage 326 of the backup pin 212. Since the outer surface of the O-ring 962 is coated with the sticking-preventing layer 964 formed of PTFE, the ball 966 is effectively prevented from sticking to the O-ring 962, even if the ball 966 may be kept in contact with the O-ring 962 for a long time or even if the ball 966 is frequently contacted with, and separated from, the O-ring 962. Thus, when the backup pin 212 is attached to the holding table 210, the open-and-close valve 956 is assuredly opened and the negative pressure is supplied to the backup pin 212.

As shown in FIG. 27, an outer surface of each ball 966 may be coated with a sticking-preventing layer 980 which is formed of, e.g., PTFE. FIG. 27 shows the sticking-preventing layer 980 having an exaggerated thickness for easier understanding purposes only. The sticking-preventing layer 980 of each ball 966 may be employed in place of, or in addition to, the sticking-preventing layer 964 of each O-ring 962.

In each of the illustrated embodiments in which each backup pin 212, 620, 650, 740 includes the elongate seat member 320, 742, the pin 286 of each backup pin may be modified such that the pin 286 is connected to one of the lengthwise opposite end portions of the seat member.

Figure 21:
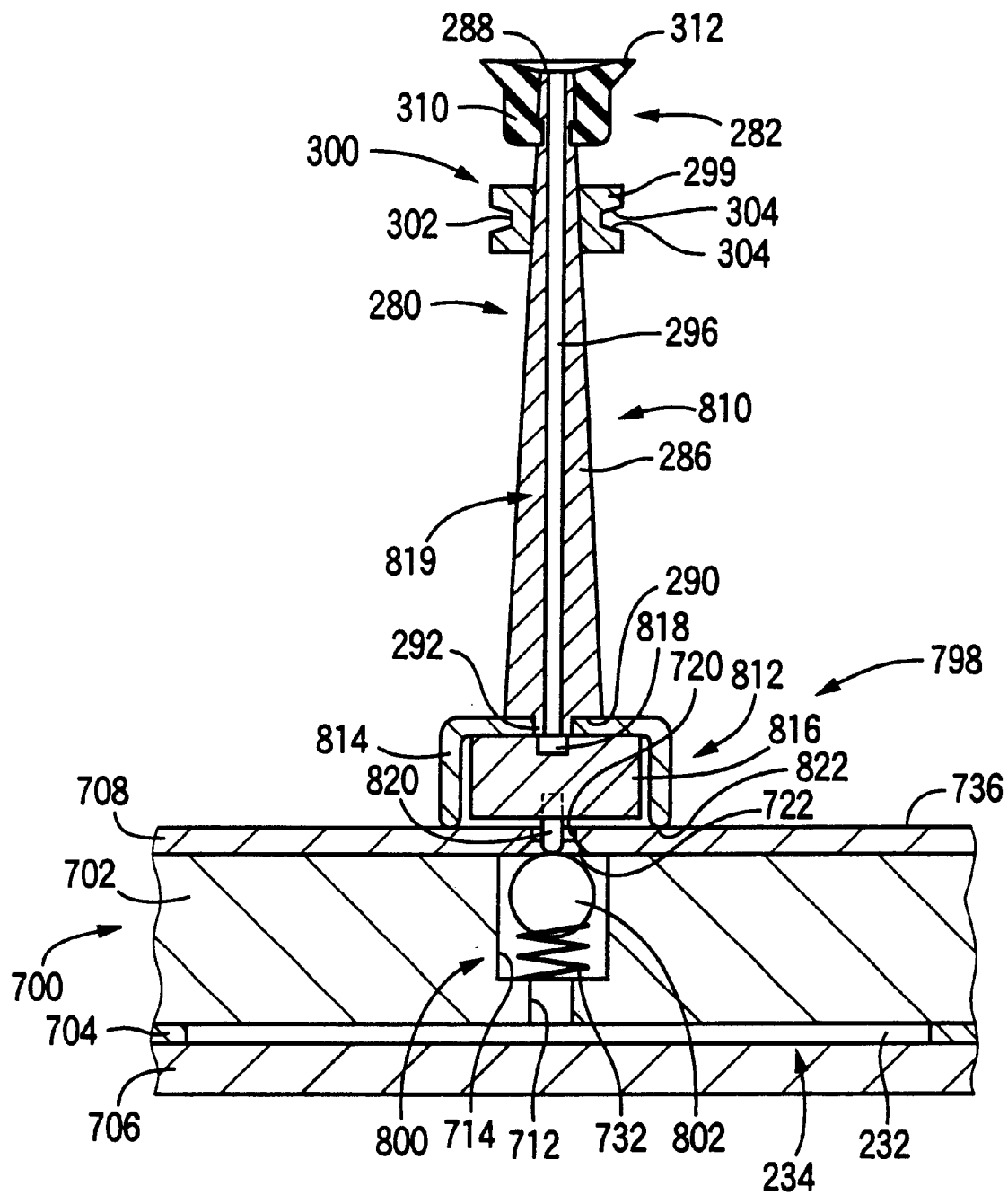
FIG. 21 is a cross-sectioned, front elevation view of another PWB holding apparatus including a holding table and a backup pin attachable to the holding table.

In the embodiment shown in FIGS. 21 and 22, each backup pin 810 supports the valve-opening projection 820, the engagement of the valve-opening projection 820 and the inner surface defining the through-hole 720 limits the range in which the backup pin 810 is allowed to move relative to the negative-pressure-supply hole 712, and the seat member 814 of the backup pin 810 has a circular cross section and has such a size which assures that the seat member 814 closely contacts a portion of the upper surface 736 of the holding table 700 that surrounds the opening of the negative-pressure-supply hole 712. However, the seat member 814 may be so modified as to have an elongate shape.

In each of the illustrated embodiments, the transferring unit 360 and others are provided on the Y-axis table 42 and, when the ECs 32 are mounted on the PWB 24, the unit 360 is moved with the suction nozzle 60. However, the transferring unit 360 may be modified such that the unit 360 is moved by the X-Y robot 48 only when the backup pins 212, 620, 650, 740, 810, 850 are attached to, and detached from, the holding table 210, 580, 598, 700, 904, 952, and such that when the ECs 32 are mounted on the PWB 24, the unit 360 waits at a waiting position or shelters to a sheltering position. For example, the transferring unit 360 may be provided on a table different from a table on which the EC mounting head 30, the rotating device 50, the elevating and lowering device 52, and others are mounted, and respective connection portions of the two tables may be connected to, and disconnected from, each other. The two tables may additionally include respective air-supply portions which are for supplying a positive-pressure air to the elevating and lowering device 366 and others. In this case, when the respective connection portions of the two tables are connected to each other, the respective air-supply portions of the two tables are simultaneously connected to each other.

For example, the Y-axis table 42 on which the suction nozzle 60 and others are provided is never detached from the X-axis table 36, and a third table on which the transferring unit 360 is provided is detached from the X-axis table 36 when the ECs 32 are mounted on the PWB 24, so that the third table waits at the waiting position. The waiting position may be a position adjacent, in the Y-axis direction, to the X-axis table 36 being positioned at its origin position. When the X-axis table 36 is returned to the origin position to reset the PWB holding apparatus 174, 596, 648, 698, 798, 848, 898, 950, the third table on which the transferring unit 360 is provided is connected to the Y-axis table 42 on which the EC mounting head 30 and others are mounted, so that the unit 360 is moved by the X-Y robot 48. After the backup pins 212, 620, 650, 740, 810, 850 are attached to the holding table 210, 580, 598, 700, 904, 952, the X-axis table 36 is moved to the origin position, so that the third table on which the unit 360 is provided is disconnected from the Y-axis table 42 on which the head 30 and others are provided, and waits at the waiting position. The Y-axis table 42 having the thus reduced weight is used for the EC mounting operation.

In each of the illustrated embodiments, the resetting operation is performed such that first, the backup pins 212, 620, 650, 740, 810, 850 currently attached to the holding table 210, 580, 598, 700, 904, 952 are all detached from the holding table and then, the backup pins needed to hold a new sort of PWB are attached to the holding table. However, in the case where the positions and phases of some of the current backup pins are common with those of some of the new backup pins, those common backup pins may be left on the holding table. In this case, only the other, current backup pins are detached from the holding table, and only the other, new backup pins are attached to the holding table.

In each of the illustrated embodiments, the Y-axis table 42 carries the various sorts of solenoid-operated direction-switch valves including the switch valve 68. However, those solenoid-operated direction-switch valves may be provided on the base 10. In this case, the weight of the Y-axis table 42 is reduced, and accordingly the table 42 can be moved at a higher acceleration.

In each of the illustrated embodiments, the backup pins 212, 620, 650, 740, 810, 850 are automatically attached to, and detached from, the holding table 210, 580, 598, 700, 904, 952. However, the attaching and the detaching may be manually performed by an operator. In the latter case, it is not needed, either, to close, with caps or the like, the negative-pressure-supply holes 224, 712, 954 to which the backup pins as the holding members are not attached, and accordingly the PWB holding apparatus 174, 596, 648, 698, 798, 848, 898, 950 in which the holding members are placed at the respective prescribed positions on the holding table can be quickly set. Thus, it needs only a short time to reset or rearrange the PWB holding apparatus employed in the EC mounting system 12.

In some of the illustrated embodiments in which the valve member of each open-and-close valve 260, 956 is formed of a ferromagnetic material, the valve member is provided by the ball 268, 966 which is entirely formed of steel as a sort of ferromagnetic material. However, the valve member may be one which includes a main portion or a core formed of a non-magnetic material, and an outer-surface layer or a shell which is formed by coating of a ferromagnetic material.

The automatic resetting apparatus may be one which does not share any elements with the EC mounting device 16, i.e., is independent of the EC mounting device 16.

In some of the illustrated embodiments in which the portion 622 of each holding member 620, 650 in the vicinity of its lower end surface 329 is formed of a ferromagnetic material, at least a portion of the support table of the storing device 340 that supports the holding members 620, 650 may be formed of a permanent magnet so that the holding members may be fixed to the support table by the magnetic force produced by the permanent magnet.

In each of the illustrated embodiments, the PWB clamping device 172 includes the respective clamping plates which are movably provided on the fixed and movable guides 188, 190, and the respective clamping cylinders which move the respective clamping plates toward the PWB hold-down portions 194 so that the clamping plates cooperate with the hold-down portions 194 to clamp the opposite end portions of the PWB 24. However, the clamping plates may be modified such that when the PWB holding apparatus 174, 596, 648, 698, 798, 848, 898, 950 is moved upward, the clamping plates are engaged with the holding table 210, 580, 598, 700, 904, 952; as the holding table is moved upward, the clamping plates are moved toward the PWB hold-down portions 194 against the biasing action of the springs; and finally, the clamping plates cooperate with the hold-down portions 194 to clamp the PWB 24.

The holding table 210, 580, 598, 700, 904, 952 of the the PWB holding apparatus 174, 596, 648, 698, 798, 848, 898, 950 may be one which should have a size corresponding to the current sort of PWB 24. In this case, in the resetting operation, the current holding table should be replaced with another holding table having a size corresponding to a new sort of PWB 24, and the clamping plates of the PWB clamping device 172 may be provided on the holding table. For example, two clamping plates are provided on opposite end portions of the holding table, respectively, that extend parallel to the PWB-convey direction, such that the clamping plates stand upright. Each holding member should have such a height which assures that an upper end surface thereof is positioned on the same plane as that on which respective upper end surfaces of the clamping plates are positioned. When the PWB holding apparatus is moved upward, the holding members suck and hold the PWB 24, the clamping plates support the lower surface 215 of the PWB 24, and cooperate with the PWB hold-down portions 194 to sandwich the opposite end portions of the PWB 24.

In each of the illustrated embodiments, the PWB elevating and lowering device 170 may be one which includes, as its drive source, a pressurized-air-operated cylinder device as a pressurized-fluid-operated actuator.

The present invention is applicable to not only a PWB holding apparatus employed in an EC mounting system including an EC mounting head which is moved in directions each having two components perpendicular to each other on a plane parallel to a surface of a PWB, so as to mount ECs on the PWB; but also a PWB holding apparatus employed in an EC mounting system including an EC mounting head; an EC-mounting-head moving device which moves the EC mounting head in a first direction on a plane parallel to a surface of a PWB; and a PWB-holding-apparatus moving device which moves the PWB holding apparatus in a second direction perpendicular to the first direction on the plane, and additionally a PWB holding apparatus employed in an EC mounting system including a plurality of EC mounting heads which are supported by a rotatable member rotatable about an axis line and which are revolved about the axis line as the rotatable member is rotated, so that the EC mounting heads are sequentially moved to a plurality of operation or stop positions including an EC-receive position, an EC-mount position, and so on, while receiving ECs from an EC supplying device and mounting the ECs on a PWB. In the last case where the EC mounting heads are revolved by an EC-mounting-head revolving device, the PWB holding apparatus may be moved by a PWB-holding-apparatus moving device in directions parallel to a surface of the PWB, so that an EC-mount place on the PWB where an EC is to be mounted is positioned at a position corresponding to the EC-mount position of each of the EC mounting heads. In addition, the EC supplying device may be moved by an EC-supplying-device moving device to supply the ECs to the EC mounting heads. In the last case where the EC mounting heads are supported by the rotatable member, the plurality of operation positions may include a position where a backup-pin storing device is provided, so that each EC mounting head may attach a backup pin to a holding table at the EC-mount position. The rotatable member may be an intermittently rotatable member which is intermittently rotated by an intermittently rotating device, or a rotatable member which is rotated by an arbitrary angle by a rotating device. In addition, the axis line about which the rotatable member is rotated may be one which is perpendicular to the surface of the PWB, or one which is inclined relative to a plane perpendicular to the surface of the PWB. Moreover, the rotatable member may be one which not only is rotated by a rotating device but also is moved by a moving device to an arbitrary position on a plane parallel to the surface of the PWB supported at a fixed position. The moving device which moves the above-indicated EC mounting head or heads functions as a moving device which moves at least one of the EC mounting head or heads and the EC supplying device or the PWB holding apparatus, relative to the other. It can be said that an EC mounting head includes an EC holding member such as an EC suction nozzle, or that an EC mounting head includes an EC-holding-member holder to which an EC holding member is detachably attached but does not include the EC holding member.

Additionally, the present invention is applicable to not only a PWB holding apparatus which holds or supports a PWB in an EC mounting system but also a PWB holding apparatus used for a different object, for example, a PWB holding apparatus which holds or supports a PWB in an operation performing device such as a circuit inspecting device which inspects an electric circuit formed on a surface of a PWB; a screen printing device which screen-prints a creamed solder on a surface of a PWB; or a high-viscous-fluid applying device which applies a single drop, or sequentially applies a plurality of drops, of a high viscous fluid such as an adhesive to a surface of a PWB. Moreover, the present invention may be embodied by combining one or more elements of each one of the illustrated embodiments with one or more elements of another or other embodiments.

It is to be understood that the present invention may be embodied with other changes, modifications, and improvements, such as those described in SUMMARY OF THE INVENTION, which may occur to a person skilled in the art without departing from the spirit and scope of the invention defined in the appended claims.

What is claimed is:

1. An apparatus for holding a printed wiring board, comprising:
    a holding table which has a flat upper surface and a plurality of negative-pressure-supply holes each of which has an opening in the upper surface;
    at least one holding member which is attachable to the upper surface of the holding table such that a lower end surface of the holding member is held in close contact with a portion of the upper surface that surrounds the opening of at least one of the negative-pressure-supply holes, the holding member having a negative-pressure passage which is formed therethrough to connect between the lower end surface thereof and an upper end surface thereof, the holding member, attached to the holding table, supporting, at the upper end surface thereof, the printed wiring board, and applying a negative pressure supplied from the at least one negative-pressure-supply hole via the negative-pressure passage thereof, to the printed wiring board and thereby holding the printed wiring board; and
    a plurality of opening and closing valves which are associated with the plurality of negative-pressure-supply holes, respectively, each of the opening and closing valves closing a corresponding one of the negative-pressure-supply holes in a state in which the holding member is not attached to detached from the portion of the upper surface of the holding table that surrounds the opening of said the corresponding one negative-pressure-supply hole, and opening said corresponding one negative-pressure-supply hole, in a state in which the holding member is attached to said portion of the upper surface, so that said the corresponding one negative-pressure-supply hole is communicated with the negative-pressure passage of the holding member, said each opening and closing valve comprising:
        a valve hole which is provided at an end portion of said corresponding one negative-pressure-supply hole on a side of the opening thereof in the upper surface of the holding table:
        a valve seat which is provided by a portion of the holding table and faces upward in the valve hole;
        a valve member which is provided in the valve hole and which closes the corresponding one negative-pressure-supply hole in a state in which the valve member is seated on the valve seat:
        one of the valve member and a portion of the holding member in a vicinity of the lower end surface thereof being formed of a permanent magnet and the other of the valve member and the portion of the holding member being formed of a ferromagnetic material, and
        a coming-off preventing portion which prevents the valve member from coming out of the valve hole, while keeping the communication between the corresponding one negative-pressure-supply hole and the negative-pressure passage of the holding member.

2. An apparatus according to claim 1, wherein
    at least the portion of the holding table is formed of a non-magnetic material.

3. An apparatus according to claim 2, wherein the each opening and closing valve further comprises a sealing member which prevents, in a state in which the valve member is seated on the valve seat, the negative pressure from leaking from between the valve member and the valve seat.

4. An apparatus according to claim 3, wherein the sealing member comprises a pad which is formed of a material softer than a material used to form the valve seat and which covers the valve seat.

5. An apparatus according to claim 3, wherein the sealing member comprises an O-ring.

6. An apparatus according to claim 3, wherein at least a surface of at least one of the valve member and the sealing member is formed of a sticking-preventing material.

7. An apparatus according to claim 1, wherein the portion of the holding member is formed of the permanent magnet and the valve member is formed of the ferromagnetic material.

8. An apparatus according to claim 1, wherein the valve member comprises a spherical member.

9. An apparatus according to claim 1, wherein the coming-off preventing portion comprises a coming-off preventing member which covers the opening of the corresponding one negative-pressure-supply hole, which is engageable with the valve member to prevent the valve member from coming off the valve hole, and which has at least one communication hole which is not closed by the valve member engaged with the coming-off preventing member, and keeps the communication between said corresponding one hole and the negative-pressure passage of the holding member.

10. An apparatus according to claim 9, wherein the portion of the holding member is formed of the permanent magnet, and the coming-off preventing member is formed of a ferromagnetic material.

11. An apparatus according to claim 9, wherein the coming-off preventing member has, in a lower surface thereof, a positioning recess which accommodates at least a portion of the valve member and thereby positions the valve member relative to the valve hole.

12. An apparatus according to claim 9, wherein the coming-off preventing member comprises a coming-off preventing plate which is fixed to the upper surface of the holding table and covers the respective valve holes of at least two opening and closing valves associated with at least a portion of the plurality of negative-pressure-supply holes.

13. An apparatus according to claim 1, wherein the plurality of negative-pressure-supply holes open in the upper surface of the holding table, such that the respective openings of the negative-pressure-supply holes are substantially uniformly distributed and substantially regularly arranged.

14. An apparatus according to claim 1, wherein the holding member includes a shank portion which supports, at an upper end surface thereof, the printed wiring board; and a suction cup which is formed of a flexible material such as rubber and is attached to an upper end portion of the shank portion such that the suction cup surrounds the upper end surface of the shank portion and closely contacts the printed wiring board.

15. An apparatus according to claim 1, wherein a lower end portion of the holding member provides a seat portion which has a connection recess opening in a lower surface thereof such that an area of an opening of the connection recess in the lower surface is not less than two times larger than an area of the opening of the corresponding one negative-pressure-supply hole in the upper surface of the holding table.

16. An apparatus according to claim 1, wherein the holding member includes a seat portion having the lower end surface and a first transverse cross section, a pin portion projecting from the seat portion and having an upper end surface and a second transverse cross section smaller than the first transverse cross section of the seat portion, and a negative-pressure passage which is formed through the seat portion and the pin portion to connect between the lower end surface and the upper end surface, the holding member, attached to the holding table, supporting, at the upper end surface of the pin portion, a local portion of the printed wiring board, and applying a negative pressure supplied from the at least one negative-pressure supply hole via the negative-pressure passage thereof, to the local portion of the printed wiring board and thereby holding the printed wiring board.

17. An apparatus for holding a printed wiring board, comprising:
 a holding table which has a flat upper surface and a plurality of negative-pressure-supply holes each of which has an opening in the upper surface;
 at least one holding member which is detachably attached to the upper surface of the holding table such that a lower end surface of the holding member is held in close contact with a portion of the upper surface that surrounds the opening of a covered one of the negative-pressure-supply holes, the holding member having a negative-pressure passage which is formed therethrough to connect between the lower end surface thereof and an upper end surface thereof, the holding member, attached to the holding table, supporting, at the upper end surface thereof, the printed wiring board, and applying a negative pressure supplied from the at least one negative-pressure-supply hole via the negative-pressure passage thereof, to the board and thereby holding the board; and
 a plurality of opening and closing valves which are associated with the plurality of negative-pressure-supply holes, respectively, each of the opening and closing valves closing a corresponding one of the negative-pressure-supply holes in a state in which the holding member is detached from the portion of the upper surface of the holding table that surrounds the opening of the corresponding one negative-pressure-supply hole, and opening the corresponding one hole, in a state in which the holding member is attached to the portion of the upper surface, so that the corresponding one hole is communicated with the negative-pressure passage of the holding member, the each opening and closing valve comprising:
  a valve hole which is provided at an end portion of the corresponding one negative-pressure-supply hole on a side of the opening thereof and which has a diameter greater than a diameter of the one negative-pressure-supply hole;
  a valve-seat member which is fixedly provided on the holding table such that the valve-seat member covers an opening of the valve hole and which has a through-hole formed therethrough and a valve seat formed around the through-hole;
  a valve member which is provided in the valve hole such that the valve member is movable to a closing position where the valve member is seated on the valve seat and to an opening position where the valve member is away from the valve seat;
  a spring member which applies a biasing force to the valve member in a direction toward the valve seat; and
  a valve-opening projection which projects from one of the holding member and the valve member, and which engages, in a state in which the holding member is held in close contact with the portion of the upper surface of the holding table that surrounds the opening of the corresponding one hole, the other of the holding member and the valve member to position the valve member at the opening position against the biasing force of the spring member, and allows the valve member to be positioned at the closing position by the biasing force of the spring member in a state in which the holding member is not held in close contact with the portion of the upper surface of the holding table.

18. An apparatus according to claim 17, wherein the valve-opening projection projects from the valve member such that in a state in which the valve member is seated on the valve seat, the projection extends through the through-hole of the valve-seat member and a free end portion of the projection is located outside the through-hole.

19. An apparatus according to claim 17, wherein the valve-opening projection projects downward from the holding member such that a free end portion of the projection is located below the lower end surface of the holding member, and such that in the state in which the holding member is attached to the holding table, the projection extends through the through-hole of the valve-seat member, projects into the valve hole, and pushes the valve member away from the valve seat against the biasing force of the spring member.

20. An apparatus according to claim 17, wherein the holding member includes a seat portion having the lower end surface and a first transverse cross section, a pin portion projecting from the seat portion and having an upper end surface and a second transverse cross section smaller than the first transverse cross section of the seat portion, and a negative-pressure passage which is formed through the seat portion and the pin portion to connect between the lower end surface and the upper end surface, the holding member, attached to the holding table, supporting, at the upper end surface of the pin portion, a local portion of the printed wiring board, and applying a negative pressure supplied from the at least one negative-pressure-supply hole, via the negative-pressure passage thereof, to the local portion of the printed wiring board and thereby holding the printed wiring board.

21. An apparatus for holding a printed wiring board, comprising:
 a holding table which has a flat upper surface and a plurality of negative-pressure-supply holes each of which has an opening in the upper surface;
 at least one holding member which is detachably attached to the upper surface of the holding table such that a lower end surface of the holding member is held in close contact with a portion of the upper surface that surrounds the opening of at least one of the negative-pressure-supply holes, the holding member including a seat portion having the lower end surface and a first transverse cross section, a pin portion projected from the seat portion and having an upper end surface and a second transverse cross section smaller than the first transverse cross section of the seat portion, and a negative-pressure passage which is formed through the seat portion and the pin portion to connect between the lower end surface and the upper end surface, the holding member, attached to the holding table, supporting, at the upper end surface of the pin portion, a local portion of the printed wiring board, and applying a negative pressure supplied from the at least one negative-pressure-supply hole, via the negative-pressure passage thereof, to the local portion of the printed wiring board and thereby holding the printed wiring board; and a plurality of opening and closing valves which are associated with the plurality of negative-pressure-supply holes, respectively, each of the opening and closing valves closing a corresponding one of the negative-pressure-supply holes in a state in which the holding member is detached from the upper surface of the holding table, and opening the corresponding one negative-pressure-supply hole, in a state in which the holding member is attached to the portion of the upper surface that surrounds the opening of the corresponding one negative-pressure-supply hole, so that the corresponding one negative-pressure-supply hole is communicated with the negative-pressure passage of the holding member.

22. An apparatus for conveying a printed wiring board, comprising:

a board conveyor which includes two belts which cooperate with each other to convey the printed wiring board; and a board holding device which is provided between the two belts and which holds the printed wiring board conveyed by the two belts, the board holding device comprising:

a holding table which has a flat upper surface and a plurality of negative-pressure-supply holes each of which has an opening in the upper surface;

at least one holding member which is detachably attached to the upper surface of the holding table such that lower end surface of the holding member is held in close contact with a portion of the upper surface that surrounds the opening of at least one of the negative-pressure-supply holes, the holding member having a negative-pressure passage which is formed therethrough to connect between the lower end surface thereof and an upper end surface thereof, the holding member, attached to the holding table, supporting, at the upper end surface thereof, the printed wiring board, and applying a negative pressure supplied from the at least one negative-pressure-supply hole via the negative-pressure passage thereof, to the board and thereby holding the board; and a plurality of opening and closing valves which are associated with the plurality of negative-pressure-supply holes, respectively, each of the opening and closing valves closing a corresponding one of the negative-pressure-supply holes in a state in which the holding member is detached from the portion of the upper surface of the holding table that surrounds the opening of the corresponding one negative-pressure-supply hole, and opening the corresponding one negative-pressure-supply hole, in a state in which the holding member is attached to the portion of the upper surface, so that the corresponding one negative-pressure-supply hole is communicated with the negative-pressure passage of the holding member.

23. An apparatus for mounting electric components on a printed wiring board, comprising:

a board conveyor which includes two belts which cooperate with each other to convey the printed wiring board;

a board holding device which is provided between the two belts and which holds the printed wiring board conveyed b the two belts; and a component mounted device which mounts electric components on the printed wiring board held by the board holding device, the board holding device comprising:

a holding table which has a flat upper surface and a plurality of negative-pressure-supply holes each of which has an opening in the upper surface;

at least one holding member which is detachably attached to the upper surface of the holding table such that a lower end surface of the holding member is held in close contact with a portion of the upper surface that surrounds the opening of at least one of the negative-pressure-supply holes, the holding member having a negative-pressure passage which is formed therethrough to connect between the lower end surface thereof and an upper end surface thereof, the holding member, attached to the holding table, supporting, at the upper end surface thereof, the printed wiring board, and applying a negative pressure supplied from the at least one negative-pressure-supply hole, via the negative-pressure passage thereof, to the board and thereby holding the board; and a plurality of opening and closing valves which are associated with the plurality of negative-pressure-supply holes, respectively, each of the opening and closing valves closing a corresponding one of the negative-pressure-supply holes in a state in which the holding member is detached from the portion of the upper surface of the holding table that surrounds the opening of the corresponding one negative-pressure-supply hole, and opening of the corresponding one negative-pressure-supply hole, in a state in which the holding member is attached to the portion of the upper surface, so that the corresponding one negative-pressure-supply hole is communicated with the negative-pressure passage of the holding member.

* * * * *